(12) United States Patent
Kuwahara et al.

(10) Patent No.: US 11,398,508 B2
(45) Date of Patent: Jul. 26, 2022

(54) THIN-FILM DEVICE

(71) Applicants: Tianma Japan, Ltd., Kanagawa (JP);
Wuhan Tianma Micro-Electronics Co., Ltd., Wuhan (CN)

(72) Inventors: Yuya Kuwahara, Kanagawa (JP);
Kazushige Takechi, Kanagawa (JP)

(73) Assignees: TIANMA JAPAN, LTD., Kanagawa (JP); Wuhan Tianma Micro-Electronics Co., Ltd., Wuhan (CN)

( * ) Notice: Subject to any disclaimer, the term of this patent is extended or adjusted under 35 U.S.C. 154(b) by 0 days.

(21) Appl. No.: 17/131,952

(22) Filed: Dec. 23, 2020

(65) Prior Publication Data
US 2021/0202540 A1 Jul. 1, 2021

(30) Foreign Application Priority Data

Dec. 27, 2019 (JP) .............................. JP2019-238578
Nov. 20, 2020 (JP) .............................. JP2020-193595

(51) Int. Cl.
*H01L 27/14* (2006.01)
*H01L 27/12* (2006.01)
*H01L 27/32* (2006.01)

(52) U.S. Cl.
CPC ...... *H01L 27/1251* (2013.01); *H01L 27/1255* (2013.01); *H01L 27/1225* (2013.01); *H01L 27/3244* (2013.01); *H01L 2227/323* (2013.01)

(58) Field of Classification Search
USPC ............................................ 257/43, 59, 72
See application file for complete search history.

(56) References Cited

U.S. PATENT DOCUMENTS 10,741,126 B2 * 8/2020 Choi .................. H01L 27/3248
2018/0175077 A1 6/2018 Koo et al.

* cited by examiner

*Primary Examiner* — Tan N Tran
(74) *Attorney, Agent, or Firm* — Sughrue Mion, PLLC

(57) ABSTRACT

A first oxide semiconductor thin-fil transistor includes a top gate electrode, a first metal oxide film, and a top gate insulating film between the top gate electrode and the first metal oxide film. A second oxide semiconductor thin-film transistor includes a bottom gate electrode, a second metal oxide film, and a bottom gate insulating film between the bottom gate electrode and the second metal oxide film. A storage capacitor stores a signal voltage to the bottom gate electrode. A first electrode of the storage capacitor includes a part of the bottom gate electrode. A source/drain region of the first oxide semiconductor thin-film transistor is in contact with the bottom gate electrode in a contact hole in the bottom gate insulating layer. Capacitance per unit area of the bottom gate insulating film is smaller than capacitance per unit area of the top gate insulating film.

15 Claims, 16 Drawing Sheets

THIN-FILM DEVICE

CROSS-REFERENCE TO RELATED APPLICATIONS

This non-provisional application claims priority under 35 U.S.C. § 119(a) on Patent Application No. 2019-238578 filed in Japan on Dec. 27, 2019, and Patent Application No. 2020-193595 filed in Japan on Nov. 20, 2020, the entire contents of which is hereby incorporated by reference.

BACKGROUND

This disclosure relates to a thin-film device.

Application of organic light-emitting diode (OLED) elements is expanding in the field of display devices. An OLED element is a current-driven light-emitting element and therefore, it does not require a backlight and in addition, achieves low power consumption, wide viewing angle, and high contrast ratio.

An active-matrix OLED display device includes pixel circuits each including a switching thin-film transistor (TFT) for selecting a pixel (subpixel) and a driving TFT for supplying electric current to an OLED element that produces the display of the pixel. Amorphous silicon TFTs, polysilicon TFTs, or oxide semiconductor TFTs can be employed for a pixel circuit.

Oxide semiconductor TFTs have increasingly been employed for a pixel circuit of a display device because of their characteristics such as low leakage current and relatively high electron mobility. Oxide semiconductor TFTs are applied to various fields other than display devices.

SUMMARY

An aspect of this disclosure is a thin-film device including: a first oxide semiconductor thin-film transistor including a top gate electrode, a first metal oxide film, and a top gate insulating film located between the top gate electrode and the first metal oxide film; a second oxide semiconductor thin-film transistor including a bottom gate electrode, a second metal oxide film, and a bottom gate insulating film located between the bottom gate electrode and the second metal oxide film; a bottom gate insulating layer including the bottom gate insulating film; and a storage capacitor configured to store a signal voltage to be applied to the bottom gate electrode. The first metal oxide film includes a first source/drain region, a second source/drain region, and a first channel region located between the first source/drain region and the second source/drain region. The second metal oxide film includes a third source/drain region, a fourth source/drain region, and a second channel region located between the third source/drain region and the fourth source/drain region. A first electrode of the storage capacitor includes a part of the bottom gate electrode. The second source/drain region is in contact with the bottom gate electrode in a contact hole in the bottom gate insulating layer. Capacitance per unit area of the bottom gate insulating film is smaller than capacitance per unit area of the top gate insulating film.

Another aspect of this disclosure is a thin-film device including: a first oxide semiconductor thin-film transistor including a top gate electrode, a first metal oxide film, and a top gate insulating film located between the top gate electrode and the first metal oxide film; a second oxide semiconductor thin-film transistor including a bottom gate electrode, a second metal oxide film, and a bottom gate insulating film located between the bottom gate electrode and the second metal oxide film; a bottom gate insulating layer including the bottom gate insulating film; and a storage capacitor configured to store a signal voltage to be applied to the bottom gate electrode. The first metal oxide film includes a first source/drain region, a second source/drain region, and a first channel region located between the first source/drain region and the second source/drain region. The second metal oxide film includes a third source/drain region, a fourth source/drain region, and a second channel region located between the third source/drain region and the fourth source/drain region. A first electrode of the storage capacitor includes a part of the bottom gate electrode. The second source/drain region is in contact with the bottom gate electrode in a contact hole in the bottom gate insulating layer. Each of the first channel region and the second channel region consists of a lower layer having a lower electron mobility and an upper layer having a higher electron mobility.

Another aspect of this disclosure is a thin-film device including: a first oxide semiconductor thin-film transistor including a top gate electrode, a first metal oxide film, and a top gate insulating film located between the top gate electrode and the first metal oxide film; a second oxide semiconductor thin-film transistor including a bottom gate electrode, a second metal oxide film, and a bottom gate insulating film located between the bottom gate electrode and the second metal oxide film; a bottom gate insulating layer including the bottom gate insulating film; and a storage capacitor configured to store a signal voltage to be applied to the bottom gate electrode. The first metal oxide film includes a first source/drain region, a second source/drain region, and a first channel region located between the first source/drain region and the second source/drain region. The second metal oxide film includes a third source/drain region, a fourth source/drain region, and a second channel region located between the third source/drain region and the fourth source/drain region. A first electrode of the storage capacitor includes a part of the bottom gate electrode. The second source/drain region is in contact with the bottom gate electrode in a contact hole in the bottom gate insulating layer. Each of the first channel region and the second channel region consists of a lower layer and an upper layer having different composition rations or different constituent elements from each other.

It is to be understood that both the foregoing general description and the following detailed description are exemplary and explanatory and are not restrictive of this disclosure.

EMBODIMENTS

Figure 1:
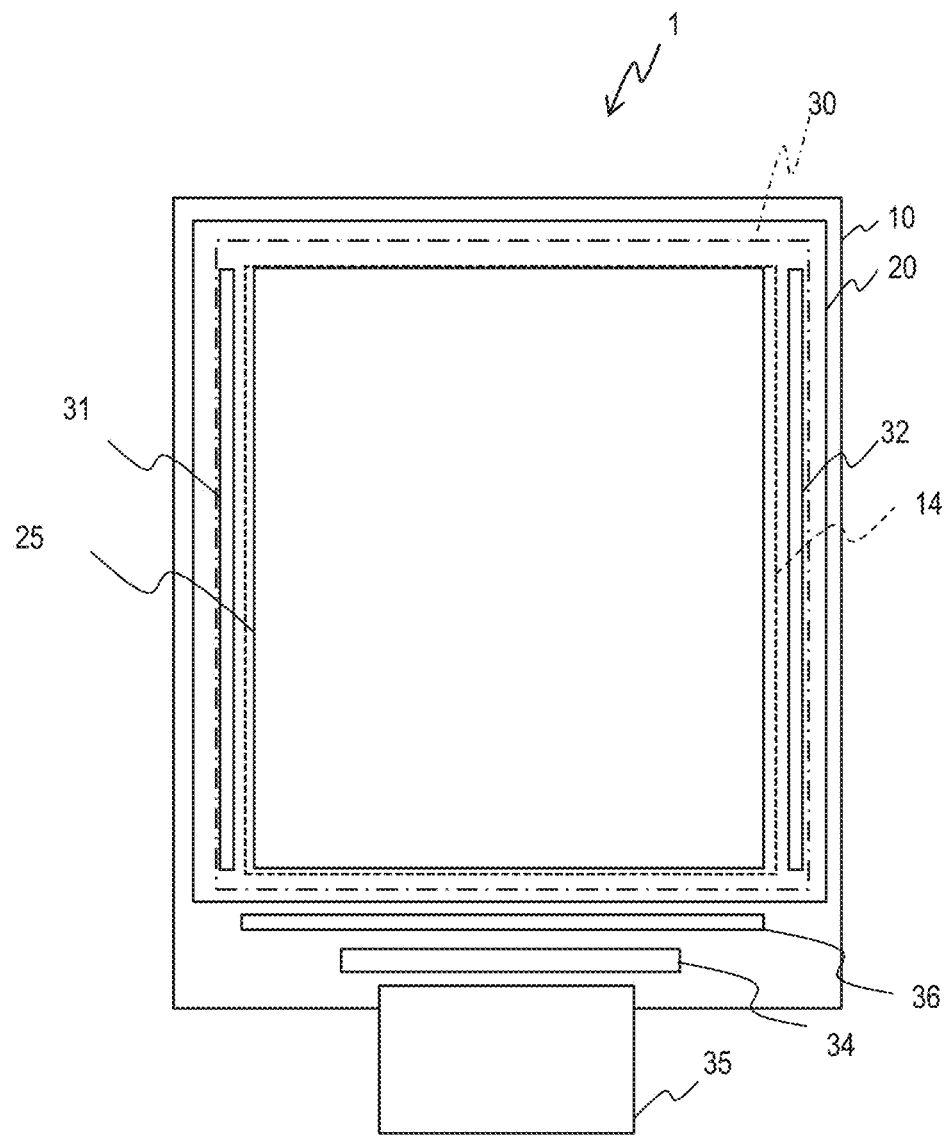
FIG. 1 schematically illustrates a configuration example of an OLED display device.

Hereinafter, embodiments of this disclosure will be described with reference to the accompanying drawings. It should be noted that the embodiments are merely examples to implement the idea of this disclosure and are not to limit the technical scope of this disclosure. Elements common to the drawings are denoted by the same reference signs and each element in the drawings may be exaggerated in size and/or shape for clear understanding of the description.

Overview

The following description employs an organic light-emitting diode (OLED) display device as an example of a thin-film device. The OLED display device in this disclosure includes oxide semiconductor thin-film transistors (TFTs) having different characteristics in a pixel circuit. A first oxide semiconductor TFT includes a top-gate electrode and a second oxide semiconductor TFT includes a bottom gate electrode. The first oxide semiconductor TFT can be a switching TFT and the second oxide semiconductor TFT can be a driving TFT.

The difference in the gate structure between the first oxide semiconductor TFT and the second oxide semiconductor TFT enables the individual TFTs to have characteristics appropriate therefor. Further, a structure such that a source/drain region of the first oxide semiconductor TFT is in contact with the bottom gate of the second oxide semiconductor TFT in a contact hole of a bottom gate insulating layer achieves a smaller number of contact holes, contributing to downsizing the circuit.

The featured configuration of a pixel circuit including oxide semiconductor TFTs disclosed herein is applicable to other circuits in the display device or circuits in thin-film devices other than display devices.

Configuration of Display Device

FIG. 1 schematically illustrates a configuration example of an OLED display device 1. The OLED display device 1 includes a thin-film transistor (TFT) substrate 10 on which OLED elements are formed, an encapsulation substrate 20 for encapsulating the OLED elements, and a bond (glass frit sealer) 30 for bonding the TFT substrate 10 with the encapsulation substrate 20. The space between the TFT substrate 10 and the encapsulation substrate 20 is filled with dry nitrogen and sealed up with the bond 30. The encapsulation substrate 20 and the bond 30 constitute a structural encapsulation unit. The structural encapsulation unit can have a thin-film encapsulation (TFE) structure.

In the periphery of a cathode electrode region 14 outer than the display region 25 of the TFT substrate 10, a scanning driver 31, an emission driver 32, a driver IC 34, and a demultiplexer 36 are provided. The driver IC 34 is connected to the external devices via flexible printed circuits (FPC) 35. The scanning driver 31 and the emission driver 32 are peripheral circuits fabricated on the TFT substrate 10.

The scanning driver 31 drives scanning lines on the TFT substrate 10. The emission driver 32 drives emission control lines to control the light emission periods of pixels. The driver IC 34 is mounted with an anisotropic conductive film (ACF), for example.

The driver IC 34 provides power and timing signals (control signals) to the scanning driver 31 and the emission driver 32 and further, provides power and a data signal to the demultiplexer 36.

The demultiplexer 36 outputs output of one pin of the driver IC 34 to d data lines in series (d is an integer more than 1). The demultiplexer 36 changes the output data line for the data signal from the driver IC 34 d times per scanning period to drive d times as many data lines as output pins of the driver IC 34.

Configuration of Pixel Circuit

Figure 2A:
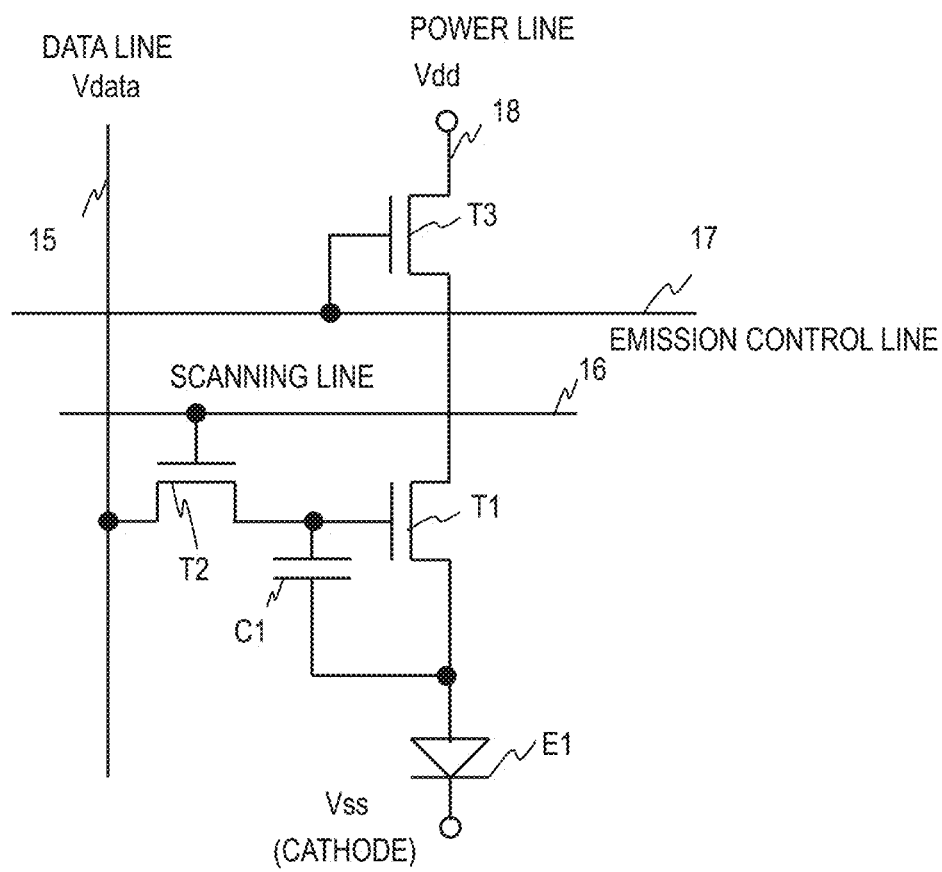
FIG. 2A illustrates a configuration example of a pixel circuit.

A plurality of pixel circuits are formed on the TFT substrate 10 to control electric current to be supplied to the anode electrodes of subpixels (also simply referred to as pixels). FIG. 2A illustrates a configuration example of a pixel circuit. Each pixel circuit includes a driving transistor T1, a selection transistor T2, an emission transistor T3, and a storage capacitor C1. The storage capacitor C1 is to store a signal voltage to be applied to the gate of the driving transistor T1. The pixel circuit controls light emission of an OLED element E1.

The selection transistor T2 is a switch (switching transistor) for selecting the sub-pixel. The selection transistor T2 is an n-channel type of oxide semiconductor TFT and its gate is connected with a scanning line 16. One source/drain is connected with a data line 15. The other source/drain is connected with the gate of the driving transistor T1.

The driving transistor T1 is a transistor (driving TFT) for driving the OLED element E1. The driving transistor T1 is an n-channel type of oxide semiconductor TFT and its gate is connected with a source/drain of the selection transistor T2. One source/drain of the driving transistor T1 is connected with a source/drain of the emission transistor T3. The other source/drain is connected with the OLED element E1 and the storage capacitor C1. The storage capacitor C1 is located between the gate and the source/drain (source) of the driving transistor T1.

The emission transistor T3 is a switch for controlling supply/stop of the driving current to the OLED element E1. The emission transistor T3 is an n-channel type of oxide semiconductor TFT and its gate is connected with an emission control line 17. One source/drain of the emission transistor T3 is connected with a source/drain of the driving transistor T1. The other source/drain is connected with a power line 18. The emission transistor T3 can be disposed between the OLED element E1 and the driving transistor T1.

Next, operation of the pixel circuit is described. The scanning driver 31 outputs a selection pulse to the scanning line 16 to turn on the selection transistor T2. The data voltage supplied from the driver IC 34 through the data line 15 is stored to the storage capacitor C1. The storage capacitor C1 holds the stored voltage during the period of one frame. The conductance of the driving transistor T1 changes in an analog manner in accordance with the stored voltage, so that the driving transistor T1 supplies a forward bias current corresponding to a light emission level to the OLED element E1.

The emission transistor T3 is located on the supply path of the driving current. The emission driver 32 outputs a control signal to the emission control line 17 to control ON/OFF of the emission transistor T3. When the emission transistor T3 is ON, the driving current is supplied to the OLED element E1. When the emission transistor T3 is OFF, this supply is stopped. The lighting period (duty ratio) in the period of one frame can be controlled by controlling ON/OFF of the transistor T3.

Figure 2B:
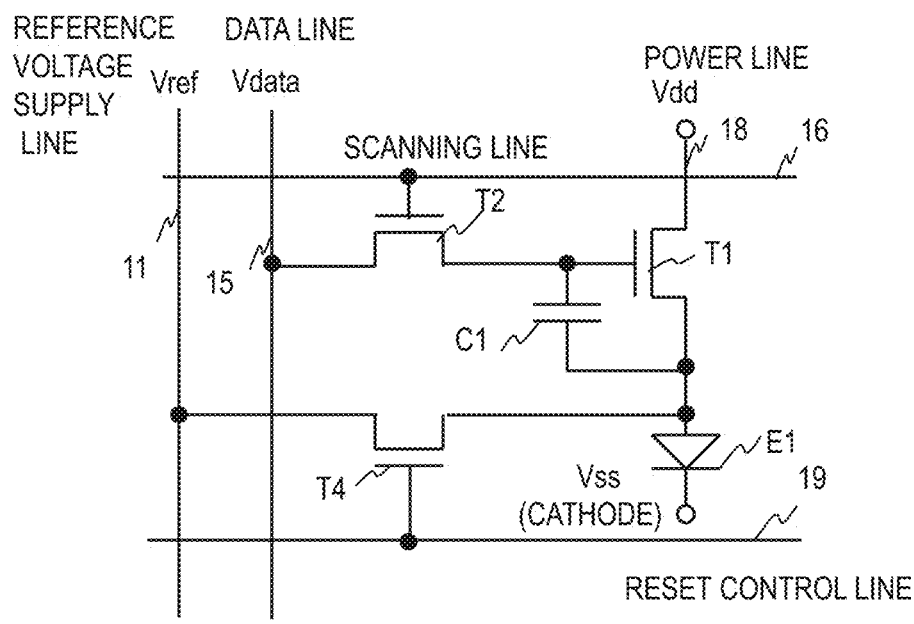
FIG. 2B illustrates another configuration example of a pixel circuit.

FIG. 2B illustrates another configuration example of a pixel circuit. This pixel circuit includes a reset transistor T4 in place of the emission transistor T3 in FIG. 2A. The reset transistor T4 is an n-channel type of oxide semiconductor TFT. The reset transistor T4 controls the electric connection between a reference voltage supply line 11 and the anode of the OLED element E1. This control is performed in accordance with a reset control signal supplied from a reset control line 19 to the gate of the reset transistor T4. This reset transistor T4 can be used for various purposes.

Figure 2C:
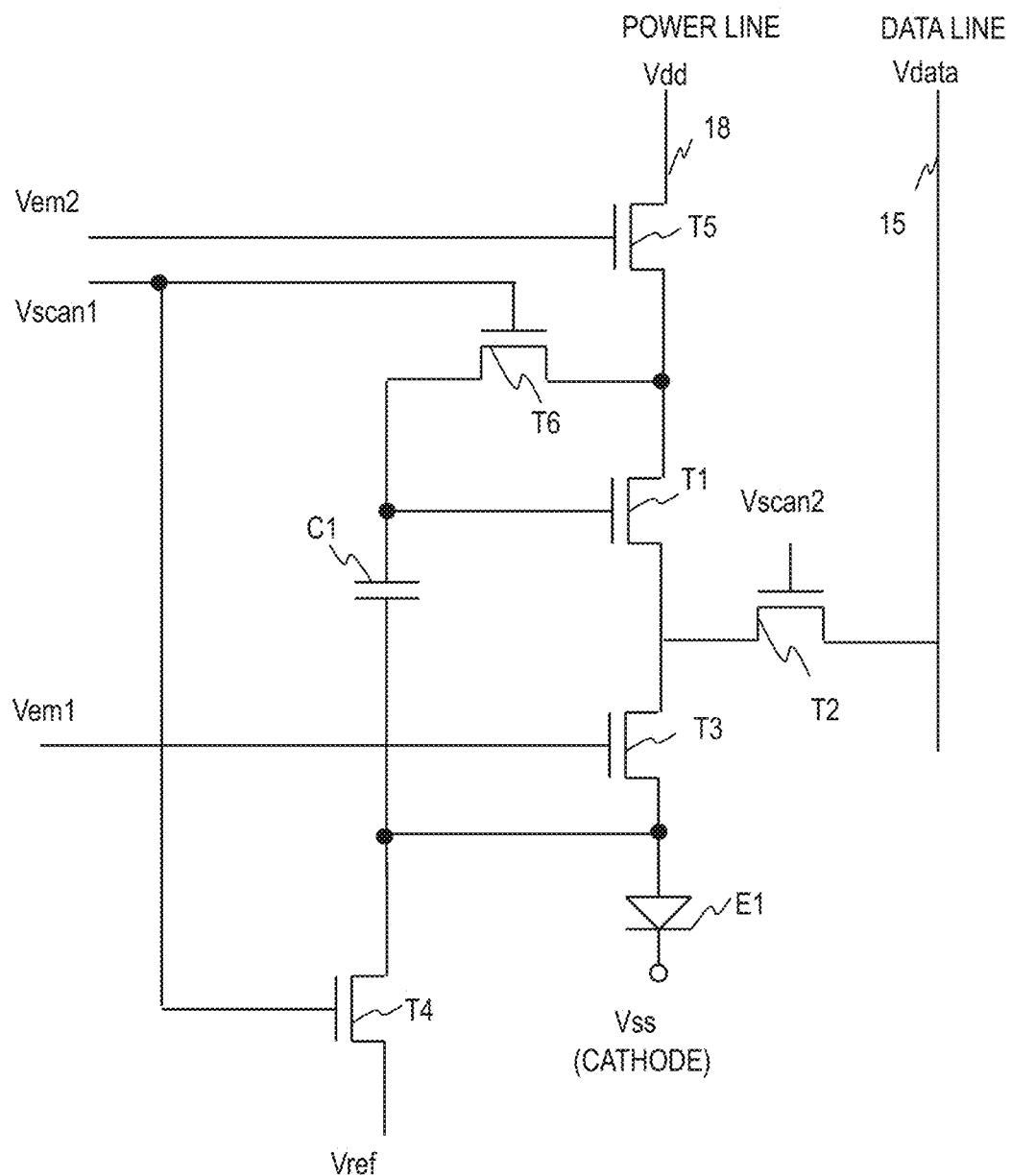
FIG. 2C illustrates still another configuration example of a pixel circuit.

FIG. 2C illustrates still another configuration example of a pixel circuit. This pixel circuit includes n-channel type of transistors T1 to T6. The gate of the transistor T2 is supplied with a Vscan2 signal and the gates of the transistors T4 and T6 are supplied with a Vscan1 signal. A storage capacitor C1 is supplied with a data signal (voltage) through the transistors T2, T1, and T6 to correct the threshold voltage of the transistor T1. The transistor T4 supplies Vref to the anode of an OLED element E1. The transistors T3 and T5 are connected with the driving transistor T1 in series and their gates are supplied with signals Vem1 and Vem2 to control light emission of the OLED element E1.

In the circuit configuration in FIG. 2C, the gate of the driving transistor T1 is connected with a source/drain of the switching transistor T6. The storage capacitor C1 is connected with the gate of the driving transistor T1 and a node between a source/drain of the switching transistor T3 and the OLED element E1. The storage capacitor C1 stores the gate voltage (gate-source voltage) for determining the amount of driving current to be supplied by the driving transistor T1.

The foregoing pixel circuits include a driving TFT (T1), a storage capacitor (C1) for storing a signal voltage between a source/drain and the gate of the driving TFT, and a switching TFT (T2 or T6) whose source/drain is connected with the gate of the driving TFT. The circuit illustrated in FIG. 2C further includes a transistor T3 connected with the driving transistor T1 in series. The pixel circuit structures described in this disclosure enable each of the driving TFT and the switching TFT to have a specific characteristic and the pixel circuit to have a smaller size, contributing to achieving higher resolution. The pixel circuit configurations in FIGS. 2A, 2B, and 2C are merely examples; the pixel circuit can have other circuit configurations.

[Characteristics of Switching TFT and Driving TFT]

Figure 3A:
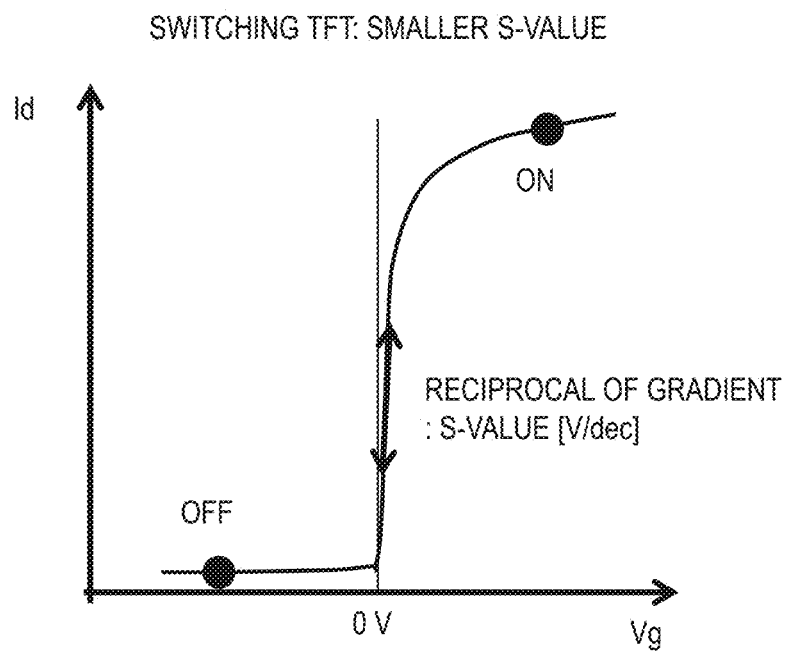
FIG. 3A schematically illustrates the current-voltage characteristic of a switching transistor.
Figure 3B:
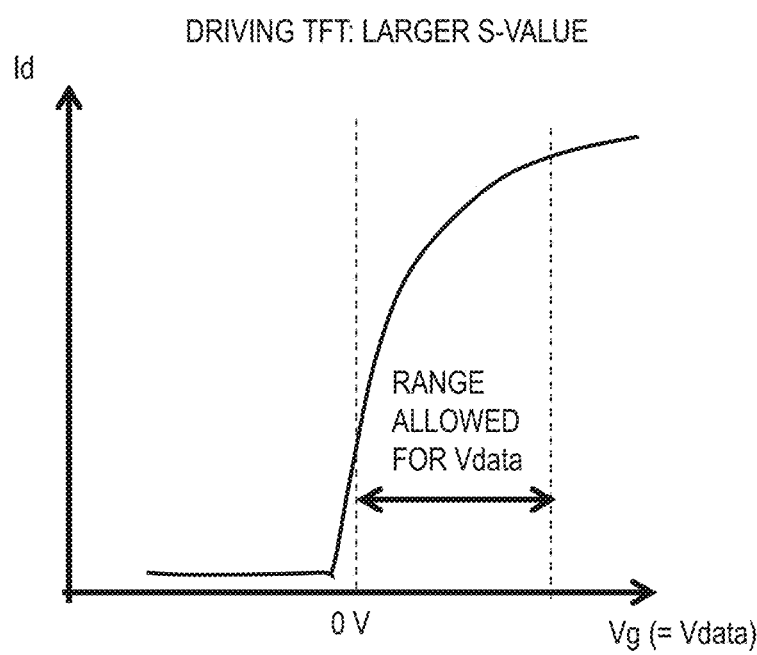
FIG. 3B schematically illustrates the current-voltage characteristic of a driving transistor.

FIG. 3A schematically illustrates the current-voltage characteristic of a switching TFT. The horizontal axis represents the gate voltage (gate-source voltage) and the vertical axis represents the drain current. FIG. 3B schematically illustrates the current-voltage characteristic of a driving TFT. The horizontal axis represents the gate voltage (gate-source voltage) and the vertical axis represents the drain current.

The switching TFT is turned ON/OFF in accordance with the gate signal and therefore, it is requested to have a characteristic that the drain current rises sharply with respect to the gate voltage (a low S-value [V/dec]). The S-value is expressed by a reciprocal of the gradient in the graph of FIG. 3A. When a switching TFT has a low S-value, the amplitude of the operating voltage (gate voltage) is allowed to be small and as a result, the voltage to be applied to the gate of the TFT (the stress by the gate voltage to the TFT) can be made small, so that the changes in threshold voltage can be reduced.

In contrast, the driving TFT for controlling the amount of current to the OLED element is requested to have a characteristic that the drain current rises gently (a high S-value). When a driving TFT has a high S-value, the driving TFT can use a wide range of data signal (Vdata); the effect of the changes in threshold voltage at lower emission levels (lower gate voltage) can be reduced.

There are two factors to determine the S-value of an TFT. One of the factors is the capacitance of the gate insulating film. The S-value can be increased by increasing the capacitance of the gate insulating film. The other factor is the interface trap density of the interface between the semiconductor film (channel region) and the gate insulating film. The S-value can be increased by increasing the interface trap density.

Figure 4A:
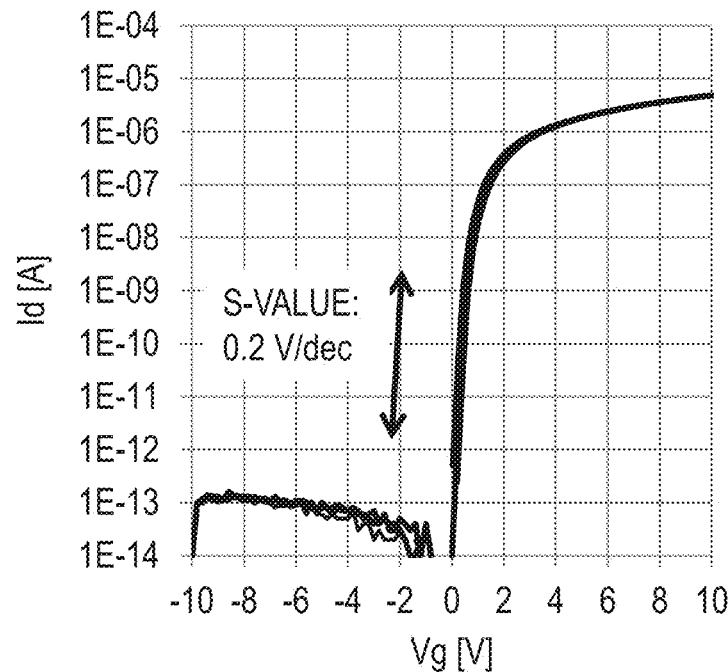
FIG. 4A illustrates the current-voltage characteristic of an oxide semiconductor TFT including a gate insulating film of 200 nm in thickness.
Figure 4B:
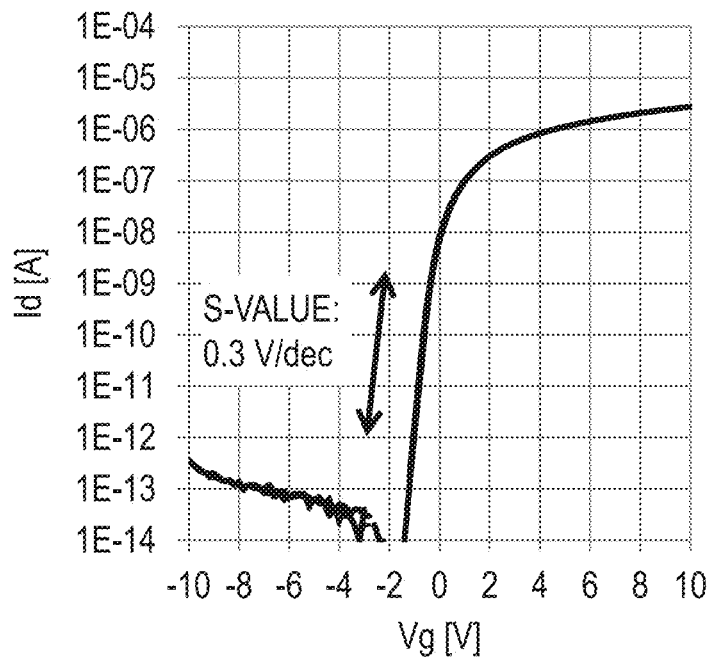
FIG. 4B illustrates the current-voltage characteristic of an oxide semiconductor TFT including a gate insulating film of 350 nm in thickness.

FIGS. 4A and 4B provide examples of current-voltage characteristics measured from oxide semiconductor TFTs having different thicknesses of gate insulating films. FIG. 4A illustrates the current-voltage characteristic of an oxide semiconductor TFT having a gate insulating film of 200 nm in thickness. FIG. 4B illustrates the current-voltage characteristic of an oxide semiconductor TFT having a gate insulating film of 350 nm in thickness.

The S-value of the oxide semiconductor TFT having a (relatively) thin gate insulating film illustrated in FIG. 4A is 0.2 V/dec. On the other hand, the S-value of the oxide semiconductor TFT having a (relatively) thick gate insulating film illustrated in FIG. 4B is 0.3 V/dec. Thickening the gate insulating film increases the capacitance of the gate insulating film. As indicated by these measurement results, the S-value of an oxide semiconductor TFT can be increased by increasing the capacitance of the gate insulating film.

Figure 5A:
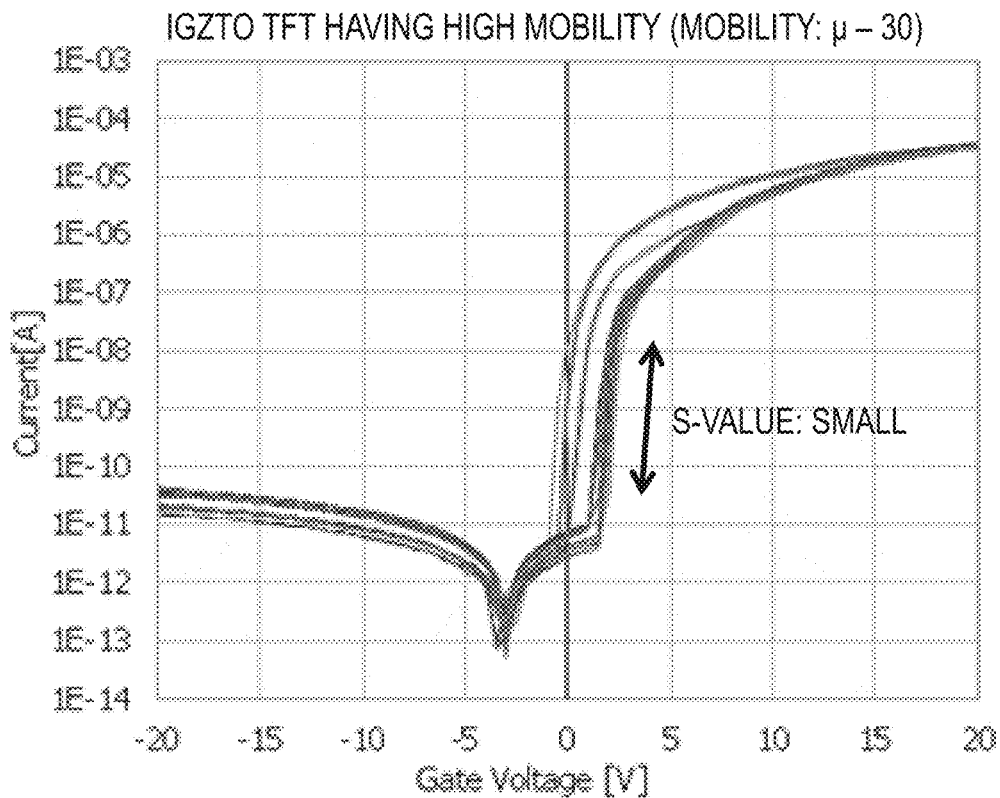
FIG. 5A illustrates the current-voltage characteristics of IGZTO TFTs having relatively high mobilities (mobility: p to 30 cm²/Vs)
Figure 5B:
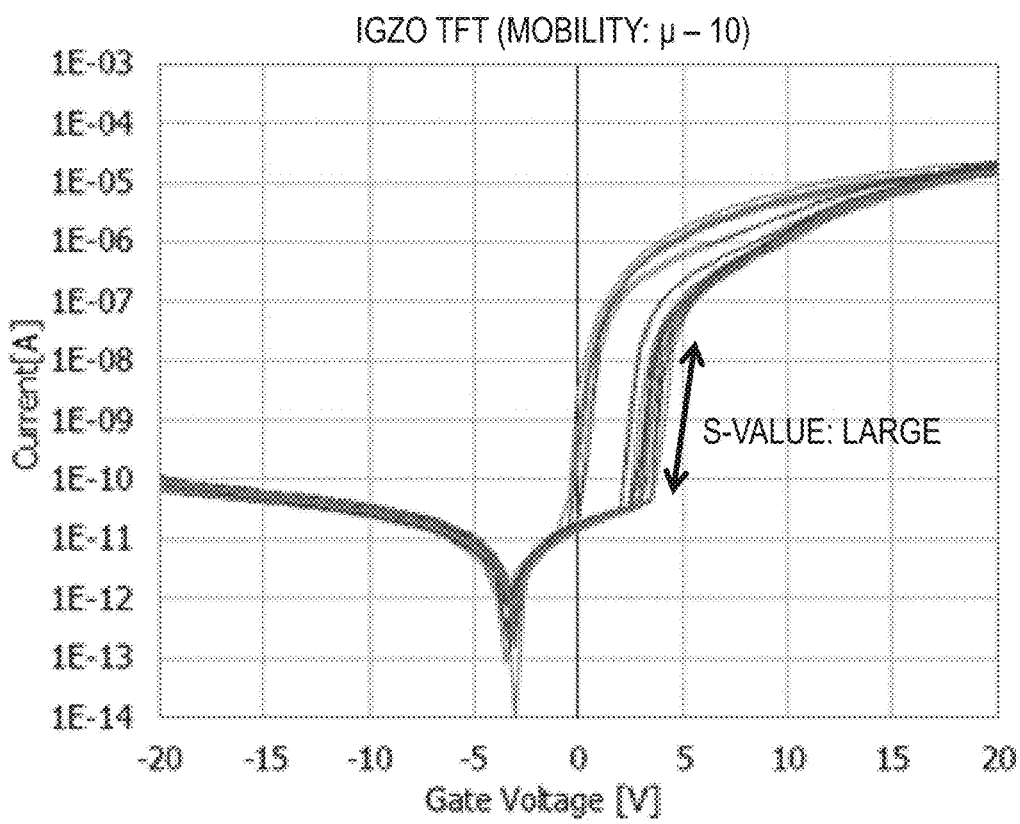
FIG. 5B illustrates the current-voltage characteristics of IGZO TFTs having relatively low mobilities (mobility: p to 10 cm²/Vs)

FIGS. 5A and 5B provide examples of current-voltage characteristics measured from oxide semiconductor TFTs employing oxide semiconductors having different mobilities. FIG. 5A illustrates the current-voltage characteristics of IGZTO TFTs having relatively high mobilities (mobility: p to 30 cm$^2$/Vs). FIG. 5B illustrates the current-voltage characteristics of IGZO TFTs having relatively low mobilities (mobility: p to 10 cm$^2$/Vs).

The S-values of the oxide semiconductor TFTs having relatively low mobilities in FIG. 5B are larger than the S-values of the oxide semiconductor TFTs having relatively high mobilities in FIG. 5A. Having low mobility means that the interface trap density of the oxide semiconductor film is large. Accordingly, the S-value of an oxide semiconductor TFT can be increased by lowering the mobility of the oxide semiconductor TFT or increasing the interface trap density.

Device Structure

Hereinafter, examples of the structure of a pixel circuit including a switching oxide semiconductor TFT (also simply referred to as switching TFT) and a driving oxide semiconductor TFT (also simply referred to as driving TFT) having different characteristics are described based on the above-described knowledge.

Figure 6A:
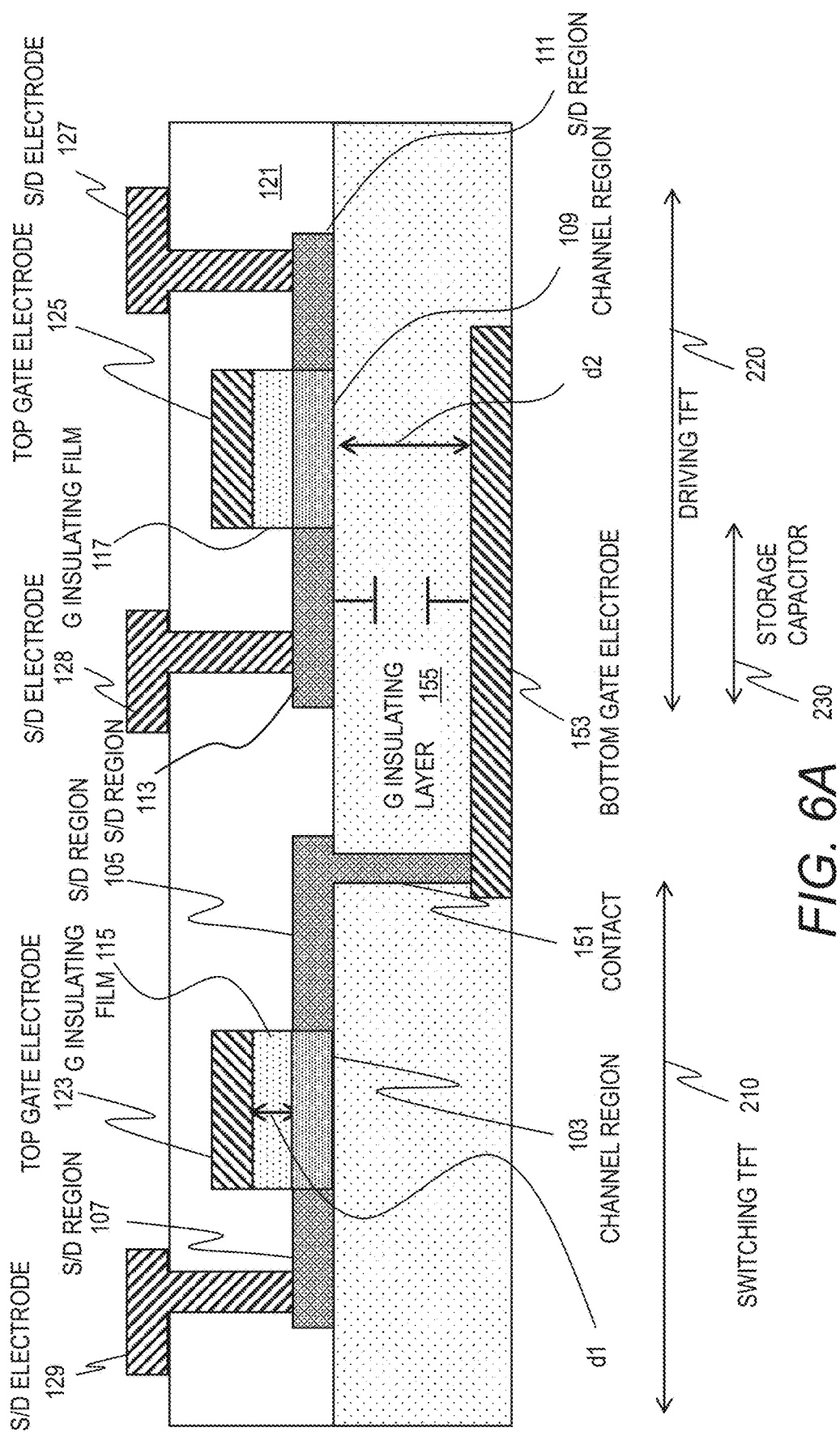
FIG. 6A schematically illustrates an example of the cross-sectional structures of a switching oxide semiconductor TFT and a driving oxide semiconductor TFT.

FIG. 6A schematically illustrates an example of the cross-sectional structures of a switching oxide semiconductor TFT (first oxide semiconductor TFT) and a driving oxide semiconductor TFT (second oxide semiconductor TFT). A switching TFT 210, a driving TFT 220, and a storage capacitor 230 are fabricated on a not-shown flexible or inflexible insulating substrate made of resin or glass.

The switching TFT 210, the driving TFT 220, and the storage capacitor 230 correspond to the selection transistor T2, the driving transistor T1, and the storage capacitor C1, respectively, in FIG. 2A or 2B.

The driving TFT 220 includes a bottom gate electrode 153 and a bottom gate insulating layer (G insulating layer) 155 between the bottom gate electrode 153 and a metal oxide film (second metal oxide film). The metal oxide film includes source/drain regions (S/D regions) 111 and 113, and a channel region 109 between the source/drain regions 111 and 113 within the same plane. The bottom gate insulating layer 155 can be a silicon oxide layer or a laminate of a silicon oxide layer (upper layer) and a silicon nitride layer (lower layer).

The metal oxide film is located directly on (in contact with) the gate insulating layer 155. The metal oxide can be indium-gallium-zinc oxide (IGZO). The source/drain regions 111 and 113 are formed of a metal oxide reduced in resistance. The channel region 109 is formed of a metal oxide (semiconductor) not reduced in resistance.

The bottom gate electrode 153 (a part thereof) is opposed to the channel region 109 across the bottom gate insulating layer 155. The bottom gate electrode 153, the bottom gate insulating layer 155, and the channel region 109 are laid one above another in this order from the bottom (the layer closer to the substrate). The gate insulating layer 155 is in contact with the channel region 109 and the bottom gate electrode 153. The part in contact with the bottom gate electrode 153 and the channel region 109 in the bottom gate insulating layer 155 corresponds to the bottom gate insulating film of the driving TFT 220.

The bottom gate electrode 153 is supplied with a data signal (signal voltage) to control the driving current for the OLED element. Another part of the bottom gate electrode 153 is also opposed to at least a part of the source/drain region 113 across the bottom gate insulating layer 155. A storage capacitor 230 is configured between the source/drain region 113 and the bottom gate electrode 153. The another part of the bottom gate electrode 153 corresponds to a lower electrode (first electrode) of the storage capacitor. The part opposed to the lower electrode in the source/drain region 113 corresponds to an upper electrode (second electrode) of the storage capacitor. The storage capacitor 230 stores the signal voltage to be supplied to the bottom gate electrode 153.

The driving TFT 220 further includes a top gate electrode 125 and a gate insulating film 117 located between the top gate electrode 125 and the channel region 109 in the layering direction. The gate insulating film 117 can be a silicon oxide film, a silicon nitride film, or a laminate of these. The channel region 109, the gate insulating film 117, and the top gate electrode 125 are laid one above another in this order from the bottom (the layer closer to the substrate); the gate insulating film 117 is in contact with the channel region 109 and the top gate electrode 125.

The top gate electrode 125 can be electrically floating. The top gate electrode 125 can be used as a mask (for self-alignment) in forming the source/drain regions 111 and 113. Further, the top gate electrode 125 shields the channel 109 from external light.

The switching TFT 210 includes a metal oxide film (first metal oxide film) on the gate insulating layer 155. In the example of FIG. 6A, the metal oxide film is located directly on the gate insulating layer 155. The metal oxide film includes source/drain regions 105 and 107, and a channel region 103 between the source/drain regions 105 and 107 within the same plane. The metal oxide can be IGZO.

The source/drain region 105 and 107 are formed of a metal oxide reduced in resistance. The channel region 103 is formed of a metal oxide (highly-resistive metal oxide) not reduced in resistance. The metal oxide film of the switching TFT 210 is included in the same metal oxide layer as the metal oxide film of the driving TFT 220 and formed together.

The switching TFT 210 further includes a top gate electrode 123 and a gate insulating film 115 located between the top gate electrode 123 and the channel region 103 in the layering direction. The gate insulating film 115 can be a silicon oxide film, a silicon nitride film, or a laminate of these. The channel region 103, the gate insulating film 115, and the top gate electrode 123 are laid one above another in this order from the bottom (the layer closer to the substrate); the gate insulating film 115 is in contact with the channel region 103 and the top gate electrode 123.

The gate insulating film 115 of the switching TFT 210 is included in the same insulating layer as the gate insulating film 117 of the driving TFT 220 and these are formed together. The top gate electrode 123 is included in the same metal layer as the top gate electrode 125 of the driving TFT 220 and these are formed together. Although the switching TFT 210 does not have a bottom gate electrode like the driving TFT 220, it can include a bottom gate electrode and in addition, the bottom gate electrode and the top gate electrode can be electrically connected to have the same potential.

The source/drain region 105 includes a contact 151 inside a contact hole opened through the gate insulating layer 155; the source/drain region 105 is in contact (directly connected) with the bottom gate electrode 153 at the contact 151.

An interlayer insulating layer 121 is formed to cover the switching TFT 210 and the driving TFT 220. Source/drain electrodes 127, 128, and 129 are in contact with the source/drain regions 111, 113, and 107, respectively, in the contact holes opened through the interlayer insulating layer 121. The source/drain electrodes 127, 128, and 129 are included in the same metal layer and they are formed together.

As to the configuration example illustrated in FIG. 6A, the characteristics of the switching TFT 210 and the driving TFT 220 can be controlled by adjusting the thickness d1 of the (top) gate insulating film 115 of the switching TFT 210 and the thickness d2 of the bottom gate insulating layer 155 of the driving TFT 220. As illustrated in FIG. 6A, the thickness d1 of the (top) gate insulating film 115 is thinner than the thickness d2 of the bottom gate insulating layer 155.

This means that the capacitance per unit area of the top gate insulating film of the switching TFT 210 is larger than the capacitance per unit area of the bottom gate insulating film (included in the bottom gate insulating layer 155) of the driving TFT 220. Hence, the S-value of the switching TFT 210 can be made smaller than the S-value of the driving TFT 220.

Furthermore, the number of contact holes for connecting the switching TFT 210 and the driving TFT 220 can be made smaller by connecting the source/drain region 105 of the switching TFT 210 with the bottom gate electrode 153 via the contact hole in the gate insulating layer 155.

Figure 6B:
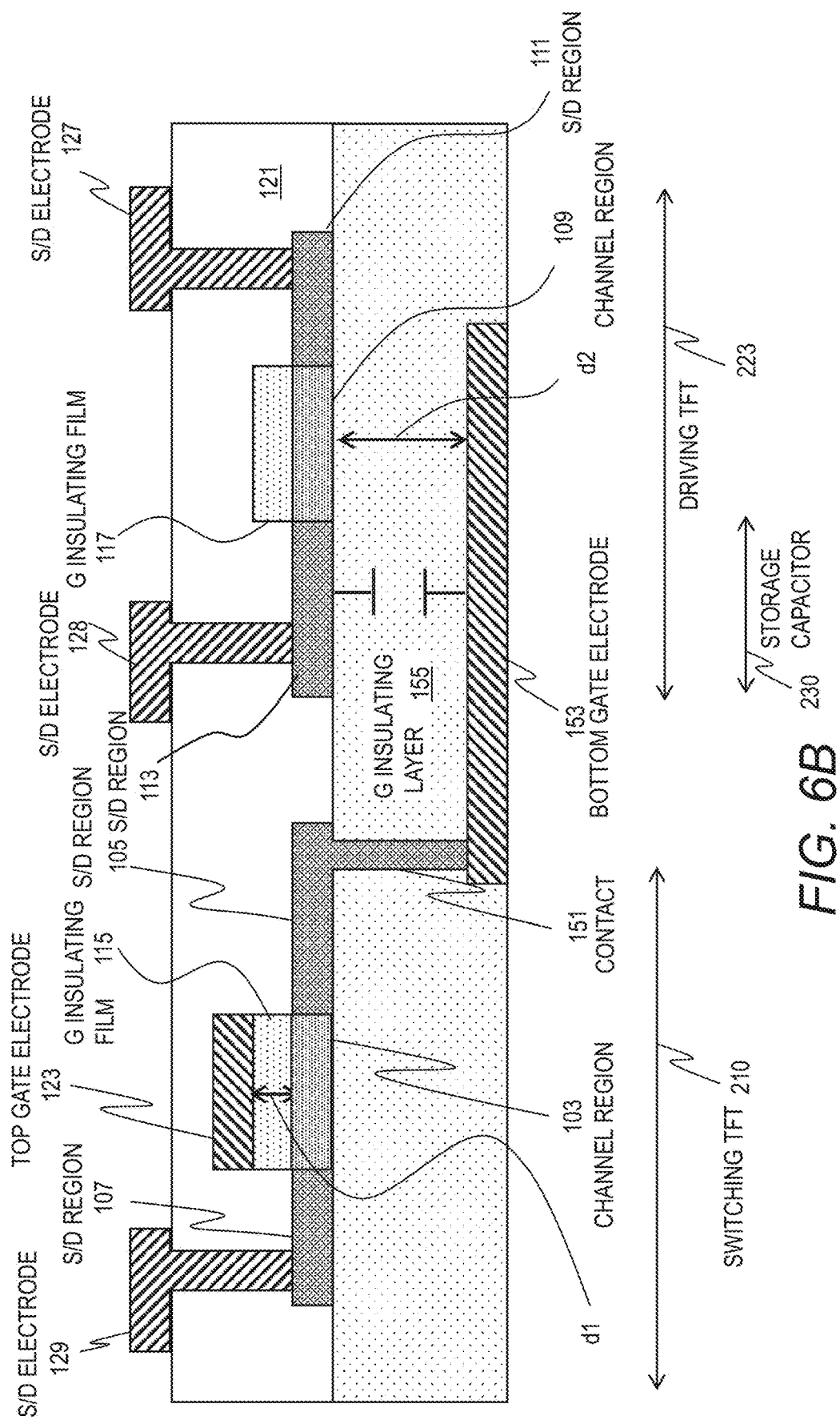
FIG. 6B schematically illustrates another example of the cross-sectional structures of a switching oxide semiconductor TFT and a driving oxide semiconductor TFT.

FIG. 6B schematically illustrates another example of the cross-sectional structures of a switching oxide semiconductor TFT and a driving oxide semiconductor TFT. The driving TFT 223 illustrated in FIG. 6B does not include the top gate electrode 125 of the driving TFT 220 in FIG. 6A. Like this driving TFT 223, the top gate electrode of a driving TFT can be omitted. The other elements in the configuration example in FIG. 6B are the same as those in the configuration example in FIG. 6A.

Figure 6C:
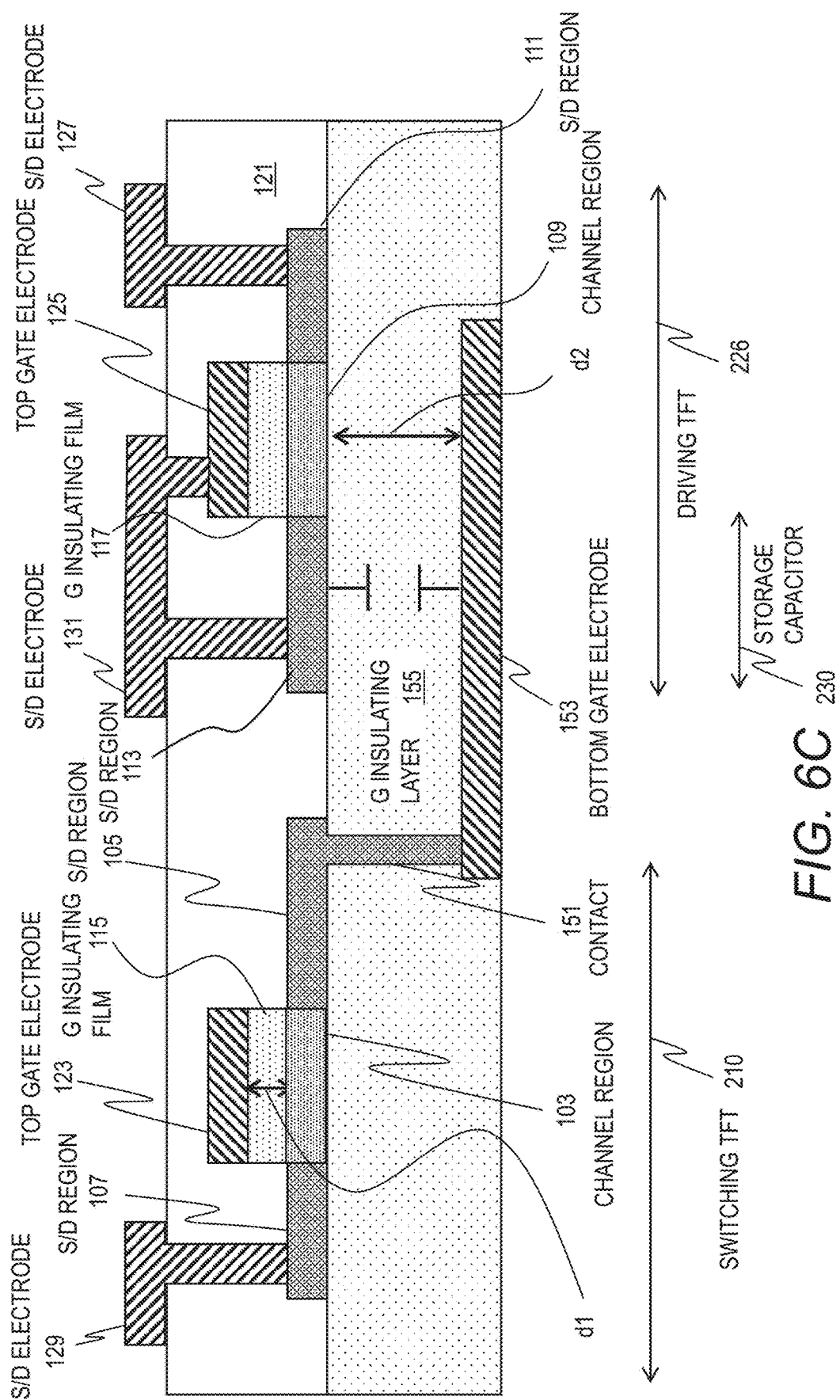
FIG. 6C schematically illustrates still another example of the cross-sectional structures of a switching oxide semiconductor TFT and a driving oxide semiconductor TFT.

FIG. 6C schematically illustrates still another example of the cross-sectional structures of a switching oxide semiconductor TFT and a driving oxide semiconductor TFT. The driving TFT 226 illustrated in FIG. 6C includes a source/drain electrode 131 connecting the top gate electrode 125 with the source/drain region 113. The source/drain electrode 131 keeps the top gate electrode 125 and the source/drain region 113 at the same potential. Maintaining the top gate electrode 125 and the source/drain region 113 at the same potential stabilizes the potential of the upper region of the channel to attain a saturation characteristic more appropriate for the driving TFT. The other elements in the configuration example in FIG. 6C are the same as those in the configuration example in FIG. 6A.

In the configuration examples illustrated in FIGS. 6A to 6C, a part of the bottom gate electrode 153 becomes a lower electrode of a storage capacitor and a part of the source/drain region 113 opposed to the lower electrode becomes an upper electrode of the storage capacitor. In the pixel circuit described with reference to FIG. 2C, the storage capacitor is located between the gate of the driving transistor T1 and a source/drain of the switching transistor T3 (third oxide semiconductor thin-film transistor). The upper electrode of the storage capacitor in this circuit configuration can include at least a part of the source/drain region of the switching transistor T3. For example, a part of the source/drain region of the switching transistor T3 that is opposed to the lower electrode can become the upper electrode. The same applies to the configuration examples illustrated in FIGS. 8 and 10.

Figure 7:
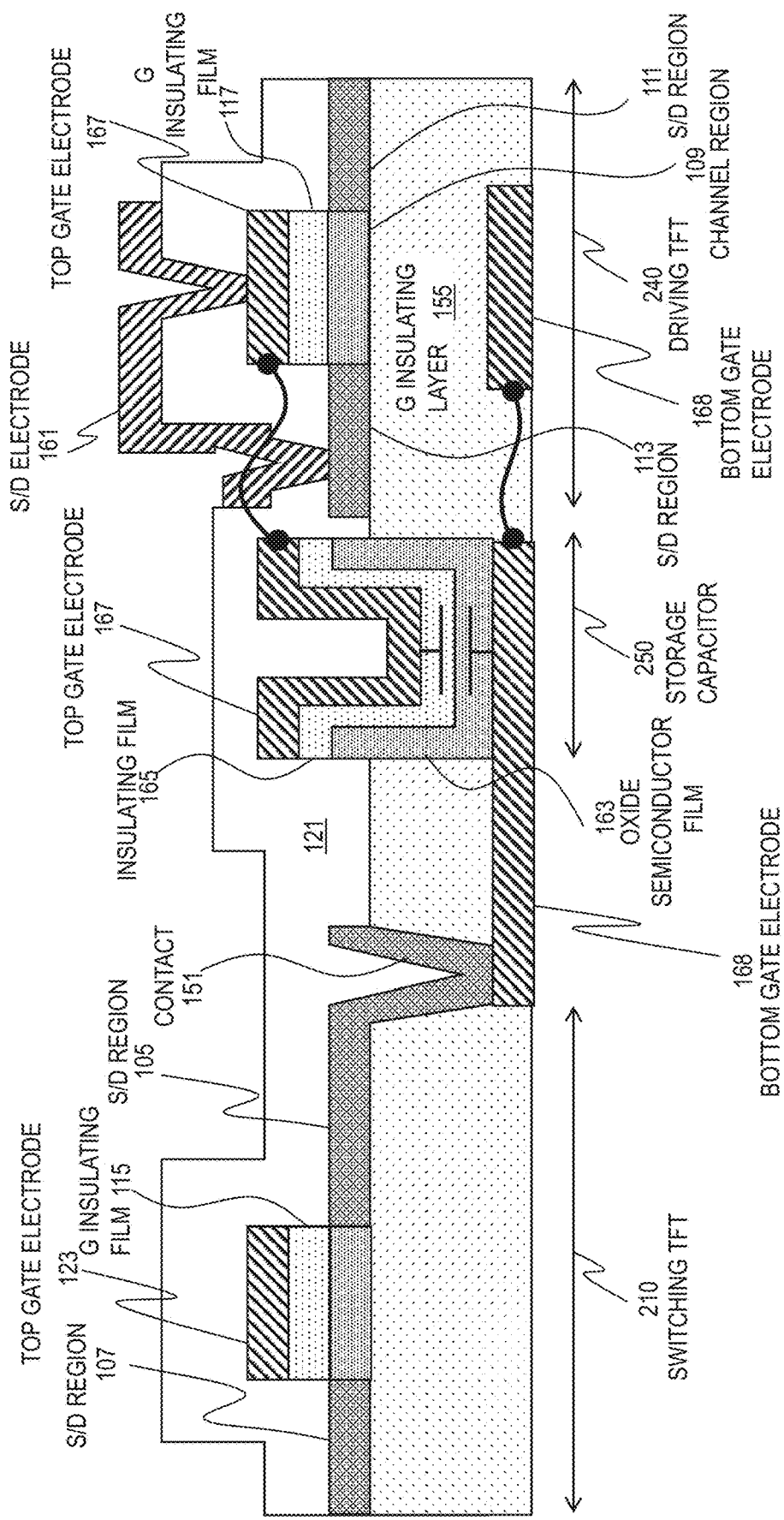
FIG. 7 schematically illustrates still another example of the cross-sectional structures of a switching oxide semiconductor TFT and a driving oxide semiconductor TFT.

FIG. 7 schematically illustrates still another example of the cross-sectional structures of a switching oxide semiconductor TFT and a driving oxide semiconductor TFT. Differences from FIG. 6A are mainly described in the following. The configuration example in FIG. 7 includes a storage capacitor 250 having a structure different from the structure of the storage capacitor 230 of the configuration example in FIG. 6A. Although the contact 151 in FIG. 7 is different in appearance from the contact 151 in FIG. 6A, this is merely a difference in the way to draw the diagram and the structure is the same.

The storage capacitor 250 in the configuration example in FIG. 7 is located between the bottom gate electrode 168 (a part thereof) and the top gate electrode 167 (a part thereof) of the driving TFT 240. Each curve with filled circles at their ends connecting two separate bottom gate electrodes 168 or two separate top gate electrodes 167 means that one end is physically continued to the other end within a plane, in other words, the both ends are included in an unseparated film.

In the configuration example in FIG. 7, the storage capacitor 250 is formed of films layered in a hole in the gate insulating layer 155. Specifically, the bottom gate electrode 168 (a part thereof), an oxide semiconductor film 163, an insulating film 165, and the top gate electrode 167 (a part thereof) are laid one above another in this order from the bottom (the layer closer to the substrate). The oxide semiconductor film 163 is in contact with the bottom gate electrode 168 and the insulating film 165. The insulating film 165 is in contact with the top gate electrode 167.

This structure of the storage capacitor 250 achieves a smaller distance between electrodes to attain a required capacitance with a smaller area. As a result, downsizing the pixel circuit becomes available.

The oxide semiconductor film 163 is included in the same layer as the metal semiconductor film of the switching TFT 210 and the metal semiconductor film of the driving TFT 240 and these films are formed together. The insulating film 165 is included in the same layer as the (top) gate insulating film 115 of the switching TFT 210 and the (top) gate insulating film 117 of the driving TFT 240 and these films are formed together.

The storage capacitor 250 in the configuration example in FIG. 7 includes the oxide semiconductor film 163 formed to cover a part of the bottom gate electrode 168. As will be described later, the oxide semiconductor film 163 prevents the part of the bottom gate electrode 168 included in the storage capacitor 250 from being etched or damaged by the etchant for the oxide semiconductor film in manufacturing an OLED display device.

The configuration example in FIG. 7 further includes a source/drain electrode 161 connecting the top gate electrode 167 and the source/drain region 113 of the driving TFT 240. The source/drain electrode 161 maintains the top gate electrode 167 and the source/drain region 113 at the same potential. Maintaining the top gate electrode 167 and the source/drain region 113 at the same potential stabilizes the potential of the upper region of the channel to attain a saturation characteristic more appropriate for the driving TFT. The source/drain electrode 161 is optional. The same applies to the configuration examples illustrated in FIGS. 9 and 10.

Figure 8:
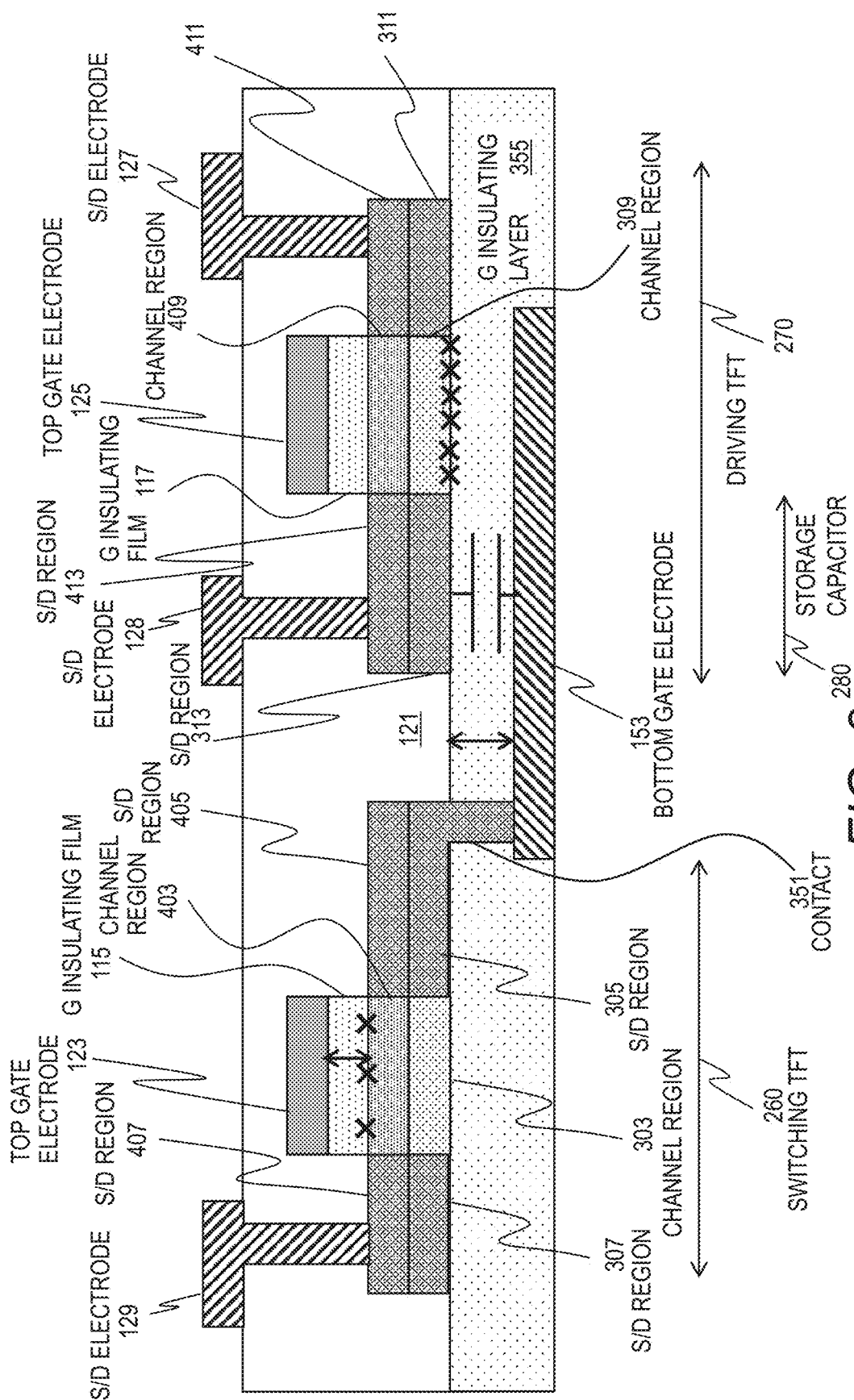
FIG. 8 schematically illustrates still another example of the cross-sectional structures of a switching oxide semiconductor TFT and a driving oxide semiconductor TFT.

FIG. 8 schematically illustrates still another example of the cross-sectional structures of a switching oxide semiconductor TFT and a driving oxide semiconductor TFT. Differences from FIG. 6A are mainly described in the following. Each of the switching TFT and the driving TFT in the configuration example in FIG. 8 includes a laminate of metal oxide films having different characteristics to achieve a characteristic suitable for the function specific to the switching TFT or the driving TFT.

The driving TFT 270 in the configuration example in FIG. 8 includes a laminate of two metal oxide films. The lower metal oxide film includes source/drain regions (S/D regions) 311 and 313 and a channel region 309 between the source/drain regions 311 and 313 in the same plane.

The two stacked metal oxide semiconductor films in the laminate have different composition ratios from each other. For example, the upper layer is InGaZnO with an In:Ga:Zn composition ratio of 2:1:1 and the lower layer is InGaZnO with an In:Ga:Zn composition ratio of 1:1:1. They have different composition ratios from each other. In this case, InGaZnO with higher In composition ratio of 2:1:1 has higher electron mobility than InGaZnO with lower In composition ratio of 1:1:1. This configuration allows two different properties as shown in FIGS. 3A and 3B.

Alternatively, these two stacked metal oxide semiconductor films may have different constituent elements from each other. For example, the upper layer may be InGaZnO and the lower layer may be ZnO. In this case, InGaZnO has higher electron mobility than ZnO. IGZTO, IGO, and IZO can also be used as the upper layer. This configuration allows two different properties as shown in FIGS. 3A and 3B.

In these configuration examples, the lower metal oxide semiconductor film is connected to the bottom gate electrode 153. The lower metal oxide film is made of a material having (relatively) low mobility (high trap density), such as IGZO.

The upper metal oxide film includes source/drain regions (S/D regions) 411 and 413 and a channel region 409 between the source/drain regions 411 and 413 in the same plane. The upper metal oxide film is made of a material having (relatively) high mobility (low trap density), such as indium-gallium-zinc-tin oxide (IGZTO). A metal oxide containing indium in higher density exhibits higher electron mobility, or lower trap density. Examples of the material having high mobility include indium-gallium oxide (IGO) and indium-zinc oxide (IZO) and examples of the material having low mobility include zinc oxide (ZnO).

The lower channel region 309 and the upper channel region 409 of the driving TFT 270 in the configuration example in FIG. 8 have the identical planar shapes. The same applies to the source/drain regions. The source/drain electrodes 127 and 128 are in contact with the source/drain regions 411 and 413, respectively, of the upper metal oxide film in the contact holes opened through the interlayer insulating layer 121.

The switching TFT 260 in the configuration example in FIG. 8 includes a laminate of two metal oxide films. The lower metal oxide film includes source/drain regions (S/D regions) 305 and 307 and a channel region 303 between the source/drain regions 305 and 307 in the same plane. The lower metal oxide film is made of a material having (relatively) low mobility (high trap density), such as IGZO. The source/drain region 305 includes a contact 351 in a contact hole opened through the gate insulating layer 355; the source/drain region 305 is in contact (directly connected) with the bottom gate electrode 153 at the contact 351.

The upper metal oxide film includes source/drain regions (S/D regions) 405 and 407 and a channel region 403 between the source/drain regions 405 and 407 in the same plane. The upper metal oxide film is made of a material having (relatively) high mobility (low trap density), such as IGZTO.

The lower channel region 303 and the upper channel region 403 of the switching TFT 260 in the configuration example in FIG. 8 have the identical planar shapes. The same applies to the source/drain regions. The source/drain electrode 129 is in contact with the source/drain region 407 of the upper metal oxide film in the contact hole opened through the interlayer insulating layer 121.

In the configuration example in FIG. 8, the lower metal oxide films of the switching TFT 260 and the driving TFT 270 are included in the same metal oxide layer and they are formed together. The upper metal oxide films of the switching TFT 260 and the driving TFT 270 are included in the same metal oxide layer and they are formed together. The upper and the lower metal oxide films of the switching TFT 260 and the driving TFT 270 are etched together to form the source/drain regions all together.

In the switching TFT 260, the upper channel region 403 has an interface with the (top) gate insulating film 115. The upper channel region 403 of the switching TFT 260 is made of a material having high mobility and exhibits a low S-value. This interface provides the switching TFT 260 with a characteristic more suitable for the switching TFT.

In the driving TFT 270, the lower channel region 309 has an interface with the bottom gate insulating layer 355. The lower channel region 309 of the driving TFT 270 is made of a material having low mobility and exhibits a high S-value. This interface provides the driving TFT 270 with a characteristic more appropriate for the driving TFT.

Since the driving TFT 270 attains a high S-value with the characteristic of the channel region, the bottom gate insulating layer 355 is allowed to be made thinner. As a result, the storage capacitor 280 formed between the bottom gate electrode 153 and the source/drain region 313 can have a smaller area. The channels of the switching oxide semiconductor TFT and the driving oxide semiconductor TFT can be made of different metal oxides.

Figure 9:
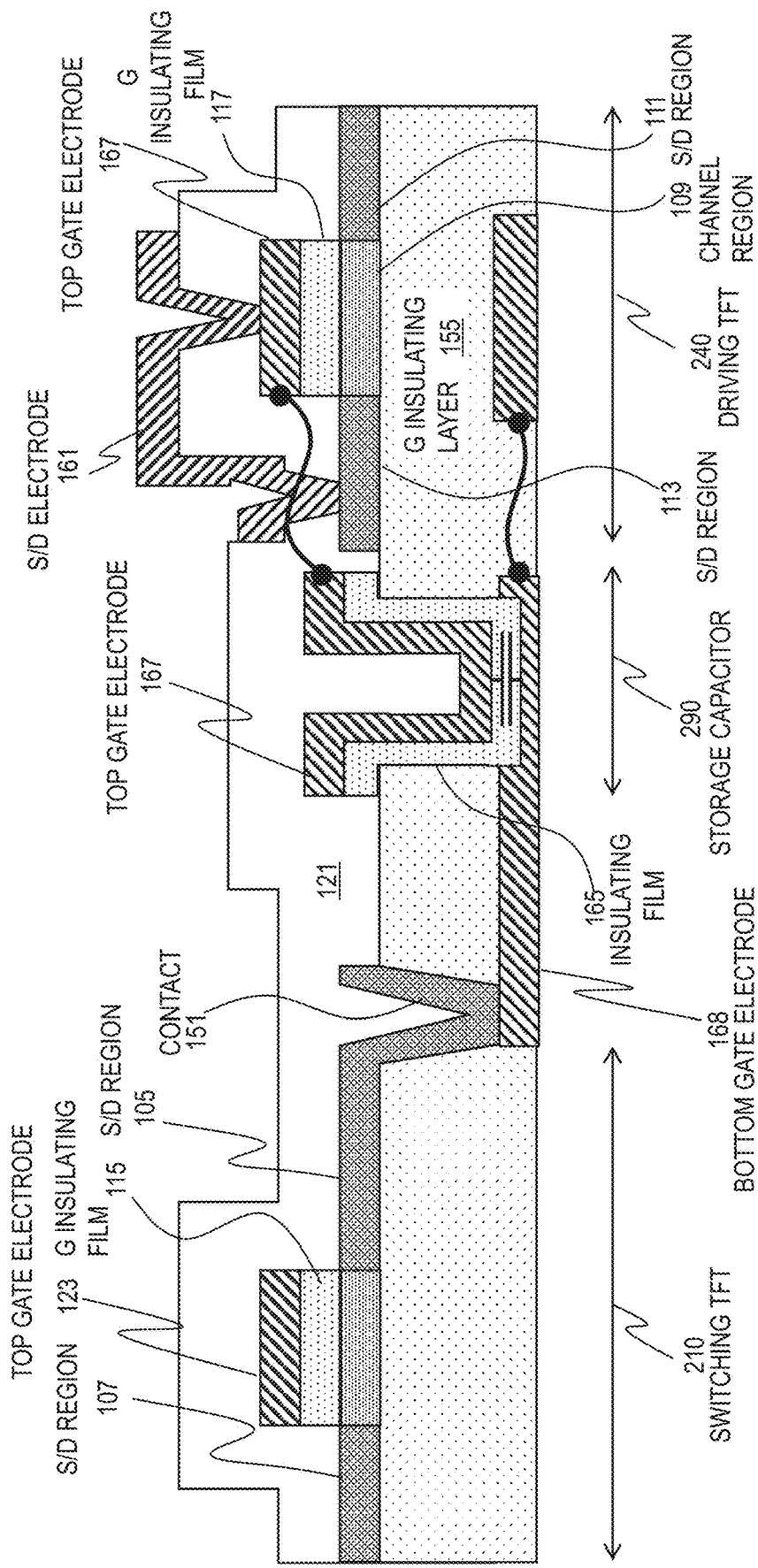
FIG. 9 schematically illustrates still another example of the cross-sectional structures of a switching oxide semiconductor TFT and a driving oxide semiconductor TFT.

FIG. 9 schematically illustrates still another example of the cross-sectional structures of a switching oxide semiconductor TFT and a driving oxide semiconductor TFT. Differences from FIG. 7 are mainly described in the following. The storage capacitor 290 in the configuration example in FIG. 9 does not include the oxide semiconductor film 163 in the storage capacitor 250 in FIG. 7. Hence, the capacitive insulating film of the storage capacitor 290 can be made thinner, so that the storage capacitor 290 can have a smaller area. Further, the storage capacitor 290 can be stabilized because of no oxide semiconductor film.

As mentioned above, the oxide semiconductor film 163 works to prevent the bottom gate electrode 168 from being etched. To attain the configuration example in FIG. 9, manufacturing an OLED display device adjusts the amount of the bottom gate electrode 168 to be etched by the etching solution or uses a selective etching solution in etching the metal oxide layer.

Figure 10:
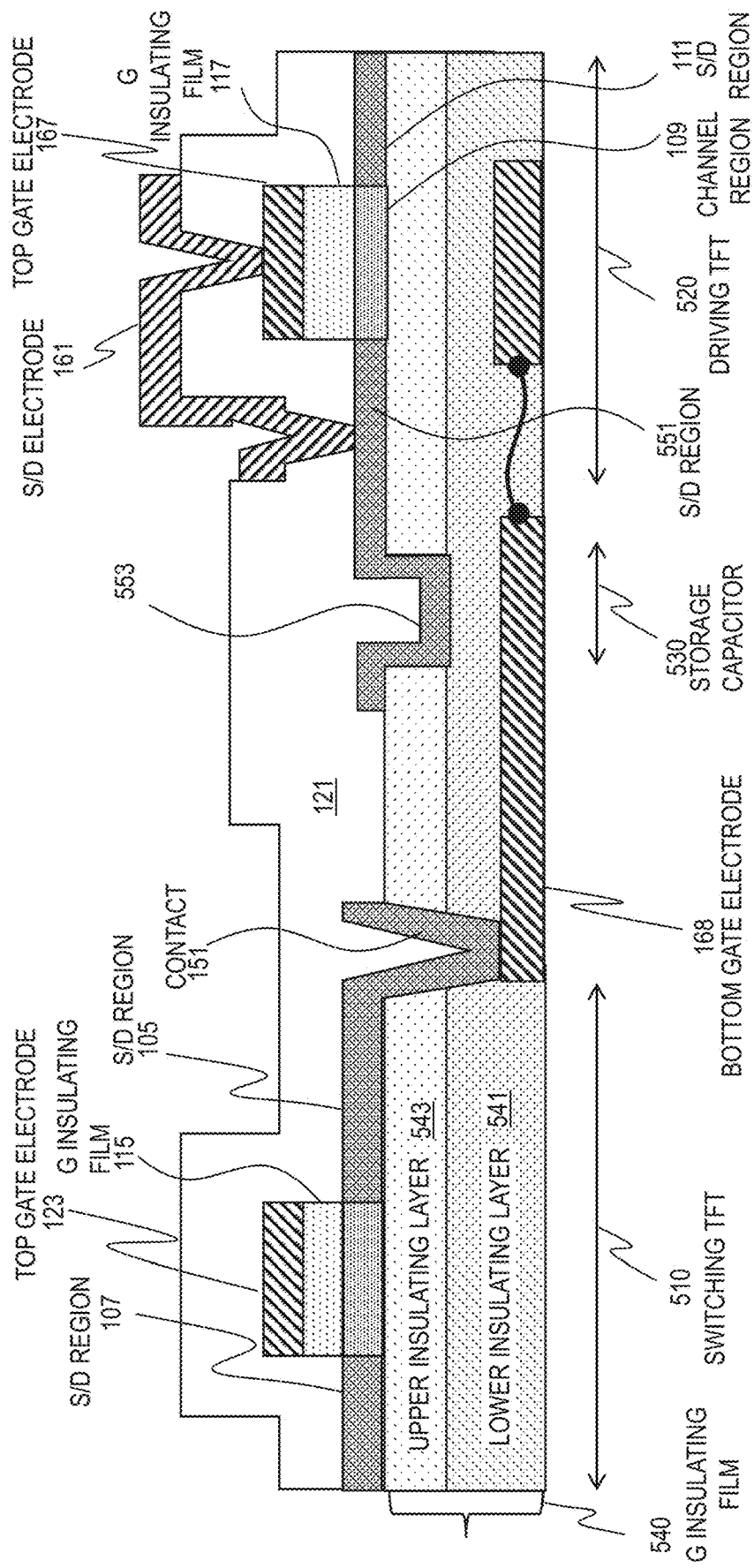
FIG. 10 schematically illustrates still another example of the cross-sectional structures of a switching oxide semiconductor TFT and a driving oxide semiconductor TFT.

FIG. 10 schematically illustrates still another example of the cross-sectional structures of a switching oxide semiconductor TFT and a driving oxide semiconductor TFT. Differences from FIG. 7 are mainly described in the following. The configuration example in FIG. 10 includes a switching TFT 510, a driving TFT 520, and a storage capacitor 530.

The configuration example in FIG. 10 includes a bottom gate insulating film 540 including a plurality of insulating layers laid one above another. The gate insulating film 540 in the configuration example in FIG. 10 consists of two insulating films of a lower insulating layer 541 and an upper insulating layer 543. The lower insulating layer 541 and the upper insulating layer 543 are located between the bottom gate electrode 168 and the channel region 109 of the driving TFT 520. Another insulating film can be included between the lower insulating layer 541 and the upper insulating layer 543.

The upper insulating layer 543 can be made of silicon oxide. The metal oxide films of the switching TFT 510 and the driving TFT 520 are formed directly on the upper insulating layer 543. Silicon oxide is one of the materials for the upper insulating layer 543 that enhance the characteristics of the metal oxide film (oxide semiconductor). The lower insulating layer 541 is made of a material having higher relative permittivity than the upper insulating layer 543. The lower insulating layer 541 can be made of silicon nitride or alumina.

The storage capacitor 530 is configured between a part of the bottom gate electrode 168 and a part of the source/drain region 551 of the driving TFT 520. The upper insulating layer 543 has a hole; a part 553 of the source/drain region 551 is in contact with the lower insulating layer 541 in the hole. The storage capacitor 530 is composed of the part 553 of the source/drain region 551 (a second electrode or an upper electrode), a part of the lower insulating layer 541, and a part of the bottom gate electrode 168 (a first electrode or a lower electrode). The capacitive insulating film of the storage capacitor 530 is one layer of the lower insulating layer 541 made of a material having high relative permittivity; the storage capacitor 530 can have a smaller area.

The configuration examples described with reference to FIGS. 6A, 6B, 6C, 8, and 10 include a storage capacitor between a source/drain region and the bottom gate electrode of the driving TFT. As illustrated in the circuit configuration example in FIG. 2C, the storage capacitor can be configured between the gate of the driving TFT and a source/drain region of a switching TFT directly connected with the driving TFT. For example, in the configuration example in FIG. 6A, 6B, 6C, 8, or 10, a part of the bottom gate electrode is opposed to at least a part of a source/drain region of the switching TFT across the insulating layers 155, 355, or 541.

Among the configuration examples described with reference to FIGS. 6A to 10, some of the elements shown in one drawing can be applied to the configuration examples in the other drawings. For example, the structure of the storage capacitor in FIG. 7 or 9 is applicable to the configuration example in FIG. 8. The elements to equalize the potential of the top gate electrode to the potential of the source/drain region shown in FIG. 7 or 9 are applicable to the configuration example in FIG. 8.

Manufacturing Method

A method of manufacturing the configuration example illustrated in FIG. 7 is described. FIGS. 11A to 11G illustrate an example of the manufacturing method. For convenience of understanding, each of FIGS. 11A to 11G shows the ranges of the switching TFT 210, the contact 151, the storage capacitor 250, and the driving TFT 240 to be fabricated by lines with arrows.

Figure 11A:
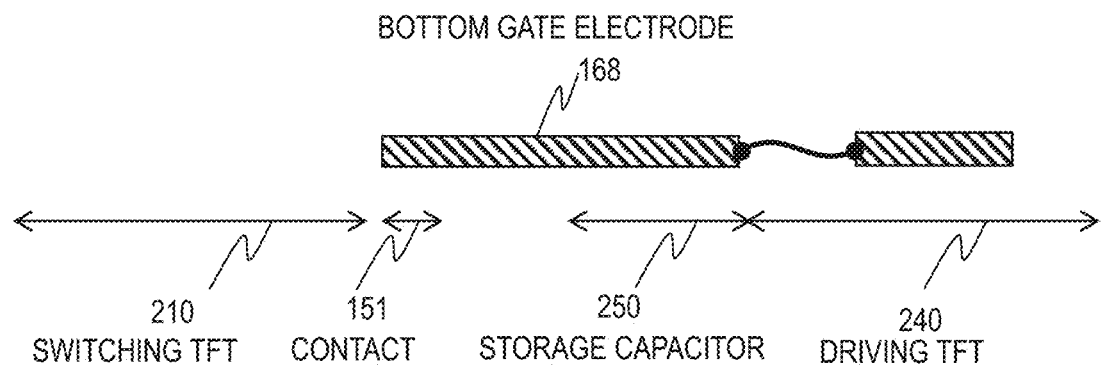
FIG. 11A illustrates a step of an example of a method of manufacturing a TFT substrate.

As illustrated in FIG. 11A, the method deposits a metal layer by sputtering on a not-shown insulating substrate and forms a bottom gate electrode 168 by photolithography and etching. A desirable metal material can be used, such as Mo, W, Nb, or Al.

Figure 11B:
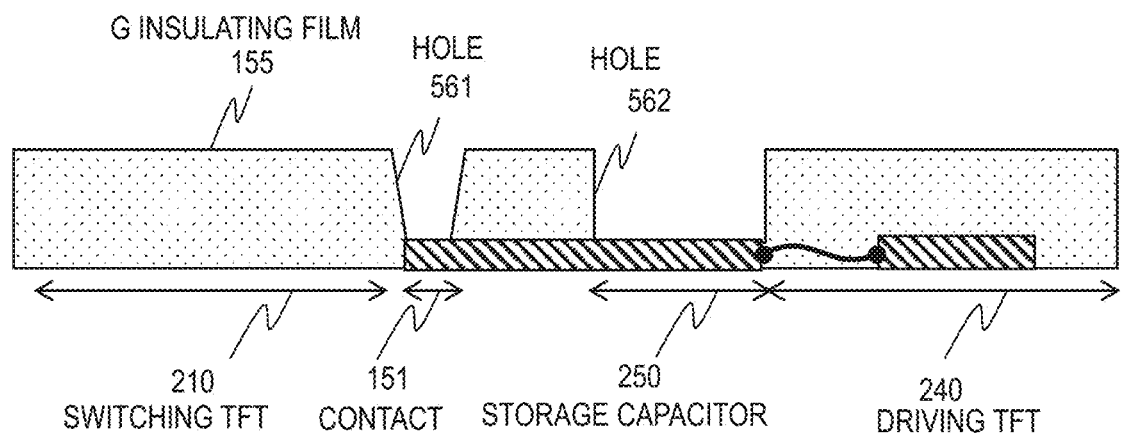
FIG. 11B illustrates a step of an example of a method of manufacturing a TFT substrate.

Next, as illustrated in FIG. 11B, the method deposits an insulating layer (for example, a silicon oxide layer) by CVD and forms a (bottom) gate insulating layer 155 by photolithography and etching. A hole 561 for forming a contact 151 and a hole 562 for forming a storage capacitor 250 are opened through the gate insulating layer 155.

Figure 11C:
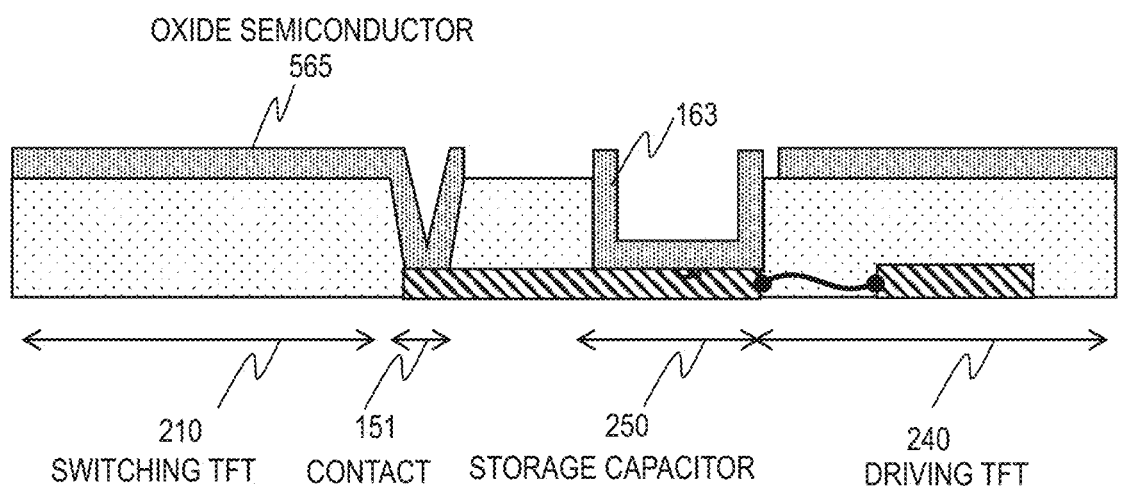
FIG. 11C illustrates a step of an example of a method of manufacturing a TFT substrate.

Next, as illustrated in FIG. 11C, the method deposits an oxide semiconductor layer (metal oxide layer) by sputtering and forms a pattern 565 of the oxide semiconductor by photolithography and etching. Parts (oxide semiconductor films) of the oxide semiconductor layer are formed inside the holes 561 and 562 of the bottom gate insulating layer 155. As described above, the oxide semiconductor film 163 inside the hole 562 covers the bottom gate electrode 168 not to expose the bottom gate electrode 168 to etching solution.

Figure 11D:
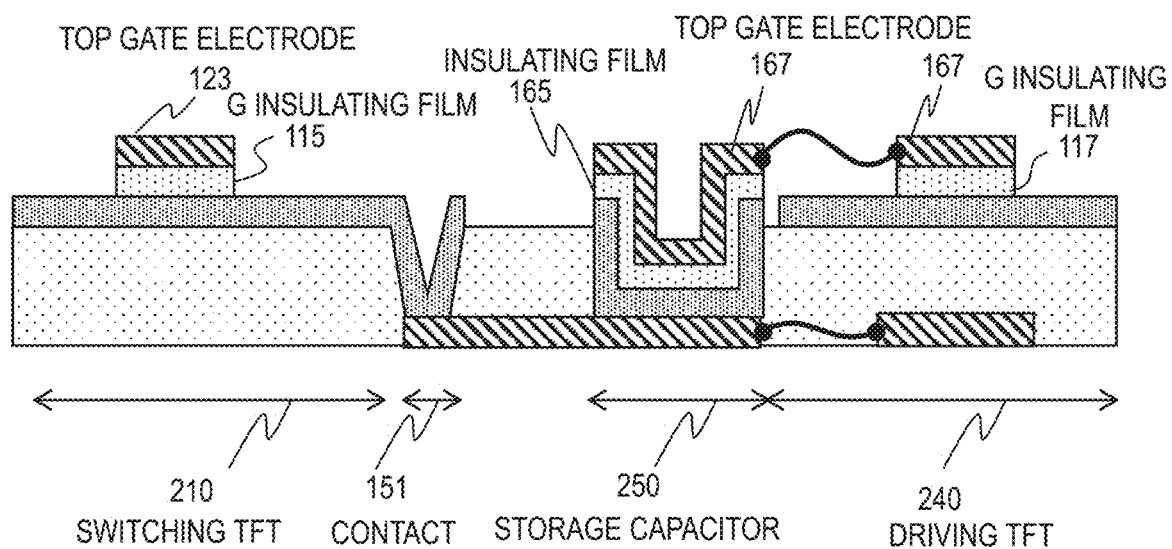
FIG. 11D illustrates a step of an example of a method of manufacturing a TFT substrate.

Next, as illustrated in FIG. 11D, the method deposits an insulating layer (for example, a silicon oxide layer) by CVD and forms top gate insulating films 115 and 117 and an insulating film 165 of the storage capacitor by photolithography and etching. Further, the method deposits a metal layer by sputtering and forms top gate electrodes 123 and 167 by photolithography and etching. A desirable metal material can be used, such as Mo, W, Nb, or Al.

Figure 11E:
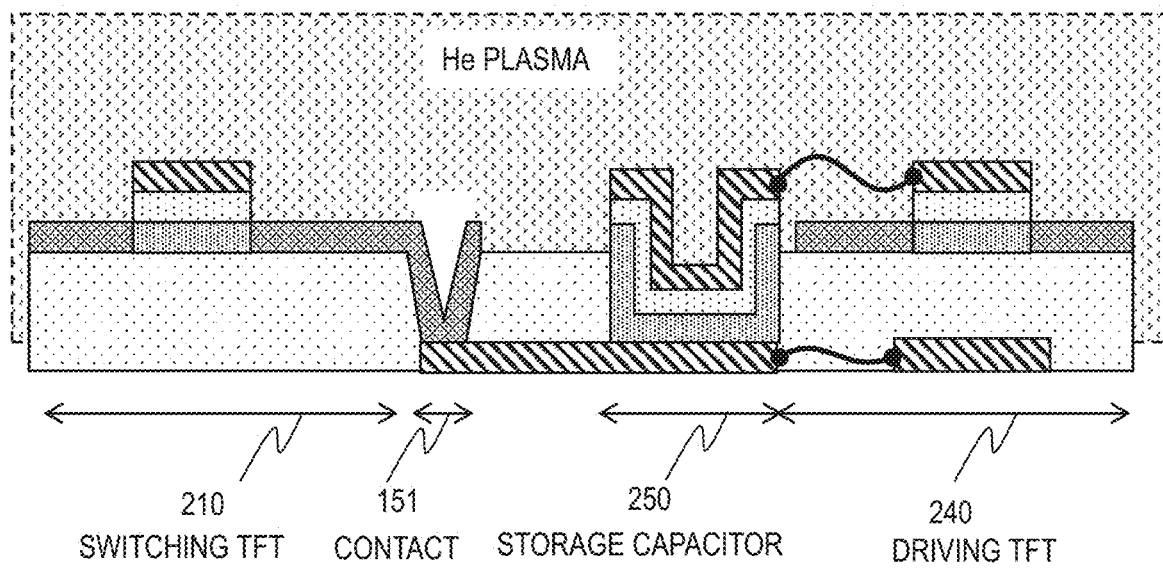
FIG. 11E illustrates a step of an example of a method of manufacturing a TFT substrate.

Next, as illustrated in FIG. 11E, the method reduces the resistance of the source/drain regions of the oxide semiconductor layer, using the top gate electrodes 123 and 167 as masks. Reducing the resistance is performed by exposing the source/drain regions of the oxide semiconductor layer to He plasma. Alternatively, reducing the resistance can be performed by implanting B, Ar, or H ions.

Figure 11F:
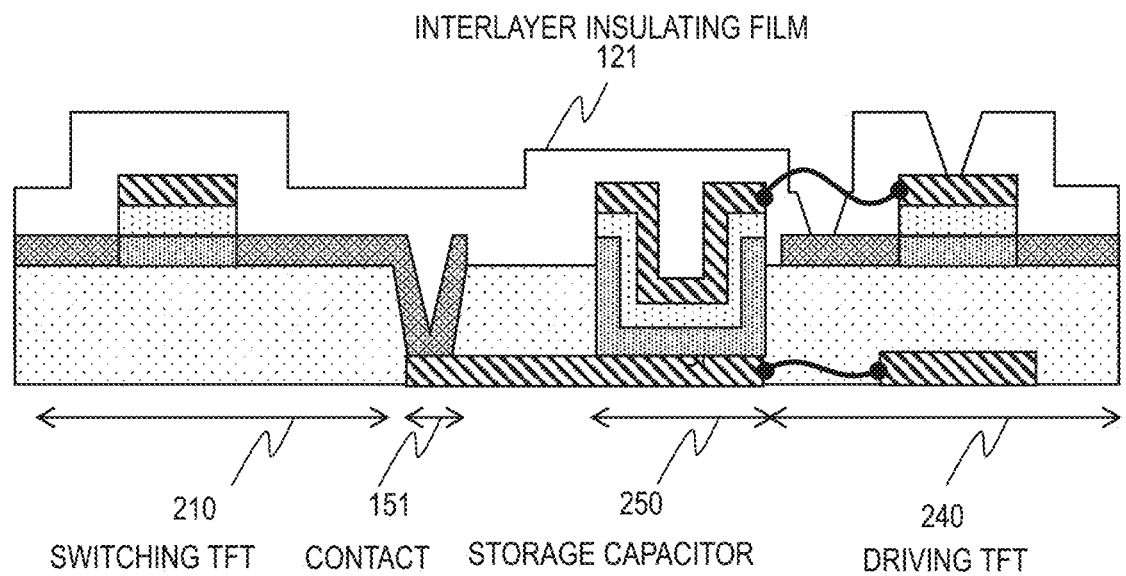
FIG. 11F illustrates a step of an example of a method of manufacturing a TFT substrate.

Next, as illustrated in FIG. 11F, the method deposits an insulating layer (for example, a silicon oxide layer) by CVD and forms an interlayer insulating layer 121 by photolithography and etching.

Figure 11G:
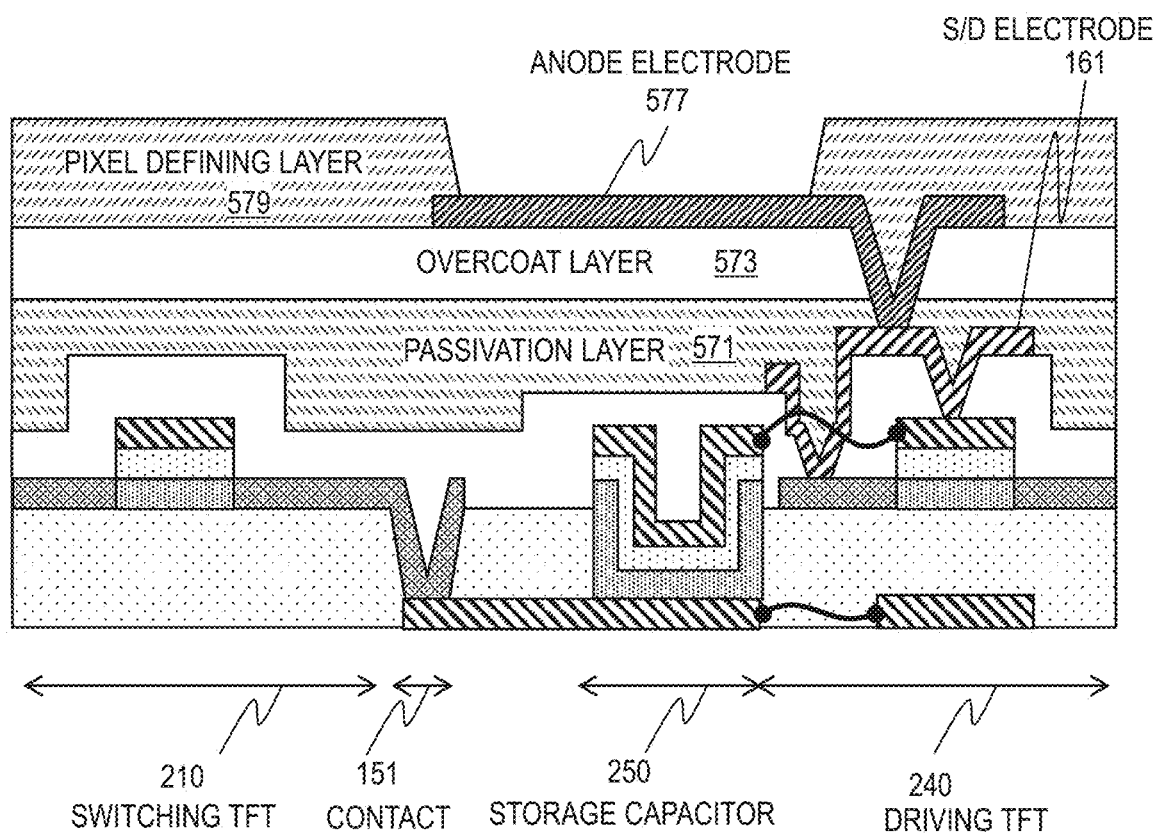
FIG. 11G illustrates a step of an example of a method of manufacturing a TFT substrate.

Next, as illustrated in FIG. 11G, the method deposits a metal layer by sputtering and forms a metal layer including a source/drain electrode 161 by photolithography and etching. This metal layer includes the source/drain electrodes of the TFTs in pixel circuits and data lines. The material and the layer structure of this metal layer can be selected desirably; for example, the metal layer is formed by depositing conductive films of Ti/Al/Ti and patterning the conductive films.

The method further deposits an insulating layer (for example, a silicon oxide layer) by CVD, forms a passivation layer 571 by photolithography and etching, and further forms an overcoat layer 573 of an organic material. An anode electrode 577 is formed on the overcoat layer 573 and it contacts the source/drain electrode 161 through a contact hole opened through the passivation layer 571 and the overcoat layer 573.

The anode electrode 577 can include three layers of a transparent conductive film, a reflective metal film, and another transparent conductive film. The transparent conductive material can be ITO or IZO. The reflective metal material can be Ag, Mg, or Al. The anode electrode 577 can be formed by sputtering and etching.

The method further deposits a photosensitive organic resin film by spin coating and patterns the photosensitive organic resin film to form a pixel defining layer 579. A hole is opened through the pixel defining layer 579 so that the anode electrode 577 is exposed at the bottom of the opened hole. The pixel defining layer 579 separates light-emitting regions of subpixels. The manufacturing the TFT substrate 10 further forms not-shown organic light-emitting films on the anode electrodes by depositing organic light-emitting materials for the colors of R, G, and B separately by color, and further, forms a not-shown cathode electrode over the entire area of the substrate.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A thin-film device comprising:
   a first oxide semiconductor thin-film transistor including a top gate electrode, a first metal oxide film, and a top gate insulating film located between the top gate electrode and the first metal oxide film;
   a second oxide semiconductor thin-film transistor including a bottom gate electrode, a second metal oxide film, and a bottom gate insulating film located between the bottom gate electrode and the second metal oxide film;
a bottom gate insulating layer including the bottom gate insulating film; and
a storage capacitor configured to store a signal voltage to be applied to the bottom gate electrode,
wherein the first metal oxide film includes a first source region, a first drain region, and a first channel region located between the first source region and the first drain region,
wherein the second metal oxide film includes a second source region, a second drain region, and a second channel region located between the second source region and the second drain region,
wherein a first electrode of the storage capacitor includes a part of the bottom gate electrode,
wherein one of the first source region and the first drain region is in contact with the bottom gate electrode in a contact hole in the bottom gate insulating layer, and
wherein capacitance per unit area of the bottom gate insulating film is smaller than capacitance per unit area of the top gate insulating film.

2. The thin-film device according to claim 1, wherein the bottom gate insulating film is thicker than the top gate insulating film.

3. The thin-film device according to claim 1,
wherein the second oxide semiconductor thin-film transistor further includes a top gate electrode, and
wherein the top gate electrode of the second oxide semiconductor thin-film transistor is connected with one of the second source region and the second drain region of the second oxide semiconductor thin-film transistor so that the top gate electrode and the connected one of the second source region and second drain region have a same potential.

4. The thin-film device according to claim 3, wherein the storage capacitor includes a structure including:
a metal oxide film included in a same layer as the first metal oxide film and the second metal oxide film and located over and in contact with the part of the bottom gate electrode;
an insulating film included in a same layer as the top gate insulating film and located over and in contact with the metal oxide film; and
a part of the top gate electrode of the second oxide semiconductor thin-film transistor being located over and in contact with the insulating film.

5. The thin-film device according to claim 3, wherein the storage capacitor includes a structure including:
an insulating film included in a same layer as the top gate insulating film of the first oxide semiconductor thin-film transistor and located over and in contact with the part of the bottom gate electrode; and
a part of the top gate electrode of the second oxide semiconductor thin-film transistor being located over and in contact with the insulating film.

6. The thin-film device according to claim 1,
wherein the bottom gate insulating layer includes a lower insulating layer and an upper insulating layer,
wherein the bottom gate insulating film includes a part of the upper insulating layer and a part of the lower insulating layer,
wherein relative permittivity of the lower insulating layer is higher than relative permittivity of the upper insulating layer, and
wherein the storage capacitor includes a structure including a part of the lower insulating layer located over and in contact with a part of the bottom gate electrode and a second electrode located over and in contact with the part of the lower insulating layer.

7. The thin-film device according to claim 1, wherein the storage capacitor includes an insulating film included in the bottom gate insulating layer.

8. The thin-film device according to claim 7, wherein a second electrode of the storage capacitor includes at least a part of one of the second source region and the second drain region.

9. The thin-film device according to claim 7, wherein a second electrode of the storage capacitor includes at least a part of one of a third source region and a third drain region of a third oxide semiconductor thin-film transistor connected in series with the first oxide semiconductor thin-film transistor.

10. The thin-film device according to claim 1, wherein each of the first source region, the first drain region, the second source region, and the second drain region is a metal oxide reduced in resistance.

11. A thin-film device comprising:
a first oxide semiconductor thin-film transistor including a top gate electrode, a first metal oxide film, and a top gate insulating film located between the top gate electrode and the first metal oxide film;
a second oxide semiconductor thin-film transistor including a bottom gate electrode, a second metal oxide film, and a bottom gate insulating film located between the bottom gate electrode and the second metal oxide film;
a bottom gate insulating layer including the bottom gate insulating film; and
a storage capacitor configured to store a signal voltage to be applied to the bottom gate electrode,
wherein the first metal oxide film includes a first source region, a first drain region, and a first channel region located between the first source region and the first drain region,
wherein the second metal oxide film includes a second source region, a second drain region, and a second channel region located between the second source region and the fourth source/drainsecond drain region,
wherein a first electrode of the storage capacitor includes a part of the bottom gate electrode,
wherein one of the first source region and the first drain region is in contact with the bottom gate electrode in a contact hole in the bottom gate insulating layer, and
wherein each of the first channel region and the second channel region consists of a lower layer having a lower electron mobility and an upper layer having a higher electron mobility.

12. The thin-film device according to claim 11, wherein density of indium included in an oxide semiconductor of the lower layer is lower than density of indium included in an oxide semiconductor of the upper layer.

13. The thin-film device according to claim 11, wherein each of the first source region, the first drain region, the second source region, and the second drain region is a metal oxide reduced in resistance.

14. A thin-film device comprising:
a first oxide semiconductor thin-film transistor including a top gate electrode, a first metal oxide film, and a top gate insulating film located between the top gate electrode and the first metal oxide film;
a second oxide semiconductor thin-film transistor including a bottom gate electrode, a second metal oxide film, and a bottom gate insulating film located between the bottom gate electrode and the second metal oxide film;

a bottom gate insulating layer including the bottom gate insulating film; and a storage capacitor configured to store a signal voltage to be applied to the bottom gate electrode, wherein the first metal oxide film includes a first source region, a first drain region, and a first channel region located between the first source region and the first drain region, wherein the second metal oxide film includes a second source region, a second drain region, and a second channel region located between the second source region and the second drain region, wherein a first electrode of the storage capacitor includes a part of the bottom gate electrode, wherein one of the first source region and the first drain region is in contact with the bottom gate electrode in a contact hole in the bottom gate insulating layer, and wherein each of the first channel region and the second channel region consists of a lower layer and an upper layer having different composition ratios or different constituent elements from each other.

15. The thin-film device according to claim 14, wherein each of the first source region, the first drain region, the second source region, and the second drain region is a metal oxide reduced in resistance.

* * * * *